US012395195B2

(12) United States Patent
Uejima et al.

(10) Patent No.: US 12,395,195 B2
(45) Date of Patent: Aug. 19, 2025

(54) RADIO-FREQUENCY MODULE AND COMMUNICATION DEVICE

(71) Applicant: Murata Manufacturing Co., Ltd., Kyoto (JP)

(72) Inventors: Takanori Uejima, Kyoto (JP); Dai Nakagawa, Kyoto (JP); Yukiya Yamaguchi, Kyoto (JP); Yuji Takematsu, Kyoto (JP); Motoji Tsuda, Kyoto (JP); Mayuka Ono, Kyoto (JP); Hiroki Fujiwara, Kyoto (JP); Kiyoshi Aikawa, Kyoto (JP); Takashi Yamada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 368 days.

(21) Appl. No.: 18/183,331

(22) Filed: Mar. 14, 2023

(65) Prior Publication Data
US 2023/0223970 A1 Jul. 13, 2023

Related U.S. Application Data

(63) Continuation of application No. PCT/JP2021/039035, filed on Oct. 22, 2021.

(30) Foreign Application Priority Data

Oct. 29, 2020 (JP) ................................. 2020-181865

(51) Int. Cl.
*H04B 1/40* (2015.01)
*H04B 1/03* (2006.01)
(Continued)

(52) U.S. Cl.
CPC ................. *H04B 1/03* (2013.01); *H04B 1/08* (2013.01); *H01Q 1/2283* (2013.01); *H01Q 1/38* (2013.01); *H04B 2001/0408* (2013.01)

(58) Field of Classification Search
CPC ... H04B 1/03; H04B 1/04; H04B 1/08; H04B 1/38; H04B 1/40; H04B 1/18;
(Continued)

(56) References Cited

U.S. PATENT DOCUMENTS 10,354,802 B1 * 7/2019 Bae ...................... H01G 4/1227
11,206,737 B2 * 12/2021 Byun ..................... H05K 3/301
(Continued)

FOREIGN PATENT DOCUMENTS

CN 101048863 A 10/2007
JP 2002-299496 A 10/2002
(Continued)

OTHER PUBLICATIONS

International Search Report for PCT/JP2021/039035 dated Jan. 11, 2022.

*Primary Examiner* — Andrew Wendell
(74) *Attorney, Agent, or Firm* — McDonald Hopkins LLC

(57) ABSTRACT

In a radio-frequency module, a conductive layer covers a major surface opposite to the mounting board side of a resin layer and a major surface opposite to the mounting board side of an electronic component. The electronic component includes an electronic component body and a plurality of outer electrodes. The electronic component body includes an electrical insulating portion and a conductive portion provided inside the electrical insulating portion, forming at least a portion of a circuit element of the electronic component. The electronic component body has a third major surface and a fourth major surface opposite to each other, and an outer side surface. The third major surface forms the major surface of the electronic component, and the third major surface is in contact with the conductive layer. The plurality of outer electrodes are provided on the fourth major surface, but are not extended over the third major surface.

24 Claims, 12 Drawing Sheets

(51) Int. Cl.
  *H04B 1/08*  (2006.01)
  *H04B 1/38*  (2015.01)
  *H01Q 1/22*  (2006.01)
  *H01Q 1/38*  (2006.01)
  *H04B 1/04*  (2006.01)

(58) Field of Classification Search
  CPC ......... H04B 2001/0408; H01Q 1/2283; H01Q 1/38; H01F 17/00; H01F 27/00; H01G 4/30; H01G 4/40; H01L 25/04; H01L 25/18; H03H 7/01; H03H 7/46; H03H 9/25; H03H 9/72
  See application file for complete search history.

(56) References Cited

U.S. PATENT DOCUMENTS

| | | | |
|---|---|---|---|
| 2004/0018693 | A1 | 1/2004 | Shioga et al. |
| 2008/0019112 | A1 | 1/2008 | Hatanaka et al. |
| 2009/0091904 | A1 | 4/2009 | Hatanaka et al. |
| 2010/0213605 | A1* | 8/2010 | Shimizu ............. H01L 25/0652 257/E23.142 |
| 2014/0353017 | A1* | 12/2014 | Noda ...................... H01L 23/50 174/257 |
| 2017/0271084 | A1* | 9/2017 | Moriya ..................... H01F 5/00 |
| 2017/0290143 | A1* | 10/2017 | Ito ......................... H05K 3/4629 |
| 2018/0061551 | A1* | 3/2018 | Kondou ................. H01F 27/323 |
| 2018/0182554 | A1* | 6/2018 | Park ....................... H05K 1/111 |
| 2018/0374788 | A1* | 12/2018 | Nakagawa .............. H01L 25/18 |
| 2019/0148281 | A1* | 5/2019 | Satoh ...................... H01L 24/17 257/778 |
| 2019/0287919 | A1* | 9/2019 | Sano .................... H01L 23/3135 |
| 2019/0304666 | A1* | 10/2019 | Arai ....................... H05K 1/111 |
| 2019/0378779 | A1 | 12/2019 | Fujii et al. |
| 2020/0275548 | A1* | 8/2020 | Imayoshi ............. H05K 3/4605 |
| 2020/0321261 | A1* | 10/2020 | Fujino ................. H01L 23/3128 |
| 2021/0020604 | A1* | 1/2021 | Nakamura ........... H01L 21/565 |
| 2021/0082895 | A1* | 3/2021 | Miura ..................... H01L 24/16 |

FOREIGN PATENT DOCUMENTS

| | | |
|---|---|---|
| KR | 10-2015-0000173 A | 1/2015 |
| WO | 2006/046713 A1 | 5/2006 |
| WO | 2007/114224 A1 | 10/2007 |
| WO | 2014/013831 A1 | 1/2014 |
| WO | 2018/159453 A1 | 9/2018 |

* cited by examiner

RADIO-FREQUENCY MODULE AND COMMUNICATION DEVICE

CROSS REFERENCE TO RELATED APPLICATION

This is a continuation of International Application No. PCT/JP2021/039035 filed on Oct. 22, 2021 which claims priority from Japanese Patent Application No. 2020-181865 filed on Oct. 29, 2020. The contents of these applications are incorporated herein by reference in their entireties.

BACKGROUND OF THE DISCLOSURE

Field of the Disclosure

The present disclosure generally relates to radio-frequency modules and communication devices, and more particularly, to a radio-frequency module including an electronic component, and a communication device including the radio-frequency module.

Description of the Related Art

Patent Document 1 discloses a module (a radio-frequency module) including a module substrate (a mounting board), a chip coil (an electronic component), a resin layer, and a metal film (a conductive layer).

In the module disclosed in Patent Document 1, the chip coil is mounted at electrodes provided on a mounting surface of the module substrate.

Patent Document 1: International Publication No. 2014/013831

BRIEF SUMMARY OF THE DISCLOSURE

In radio-frequency modules such as the module disclosed in Patent Document 1, for the purpose of preventing two outer electrodes of an electronic component, for example the chip coil, and the metal film from being short-circuited, it is necessary to interpose a portion of the resin layer between the electronic component and the metal film in the thickness direction of the module substrate. For this reason, in the radio-frequency module disclosed in Patent Document 1, it is difficult to increase an element value (for example, inductance or capacitance) of a circuit element (for example, an inductor or capacitor) included in the electronic component.

A possible benefit of the present disclosure is to provide a radio-frequency module and a communication device in which the element value of a circuit element included in an electronic component can be increased.

A radio-frequency module according to an aspect of the present disclosure includes a mounting board, an electronic component, a resin layer, and a conductive layer. The mounting board has a first major surface and a second major surface opposite to each other. The electronic component is mounted on the first major surface of the mounting board. The resin layer is provided on the first major surface of the mounting board. The resin layer covers at least a portion of an outer side surface of the electronic component. The conductive layer covers at least a portion of a major surface opposite to a mounting board side of the resin layer and at least a portion of a major surface opposite to a mounting board side of the electronic component. The electronic component includes an electronic component body and a plurality of outer electrodes. The electronic component body includes an electrical insulating portion and a conductive portion that is provided inside the electrical insulating portion and that forms at least a portion of a circuit element of the electronic component. The electronic component body has a third major surface and a fourth major surface, which are opposite to each other, and an outer side surface. In the electronic component, the third major surface of the electronic component body forms the major surface of the electronic component, and the third major surface of the electronic component body is in contact with the conductive layer. The plurality of outer electrodes are provided on the fourth major surface of the electronic component body, and the plurality of outer electrodes are not extended over the third major surface.

A communication device according to an aspect of the present disclosure includes the radio-frequency module described above and a signal processing circuit. The signal processing circuit is coupled to the radio-frequency module.

In the radio-frequency module and communication device according to the aspects of the present disclosure described above, the element value of a circuit element included in the electronic component can be increased.

BRIEF DESCRIPTION OF THE SEVERAL VIEWS OF THE DRAWINGS

FIG. 2 is a sectional view taken along line X-X in FIG. 1.

FIG. 3 is a sectional view taken along line Y-Y in FIG. 1.

FIG. 10 is a sectional view taken along line X-X in FIG. 9.

FIG. 11 is a sectional view taken along line Y-Y in FIG. 9.

DETAILED DESCRIPTION OF THE DISCLOSURE

Figure 1:
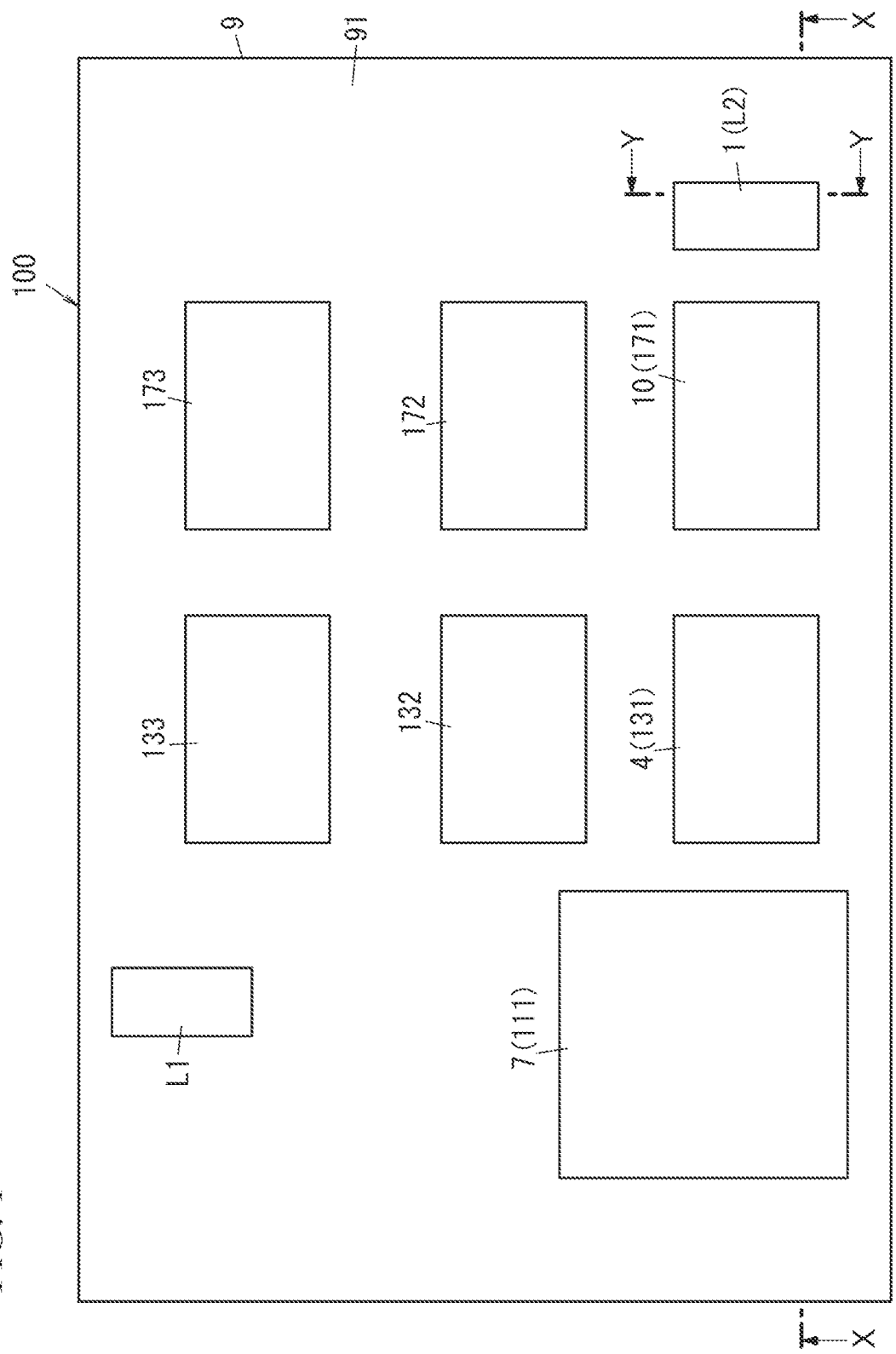
FIG. 1 is a plan view of a radio-frequency module according to a first embodiment.

FIGS. 1 to 4, 6, 7, and 9 to 14, which will be referred to in the following embodiments and other examples, are all schematic drawings, and the proportion of size and thickness of each constituent element in the drawings is not necessarily identical to the corresponding proportion in actual measurements.

First Embodiment

Figure 2:
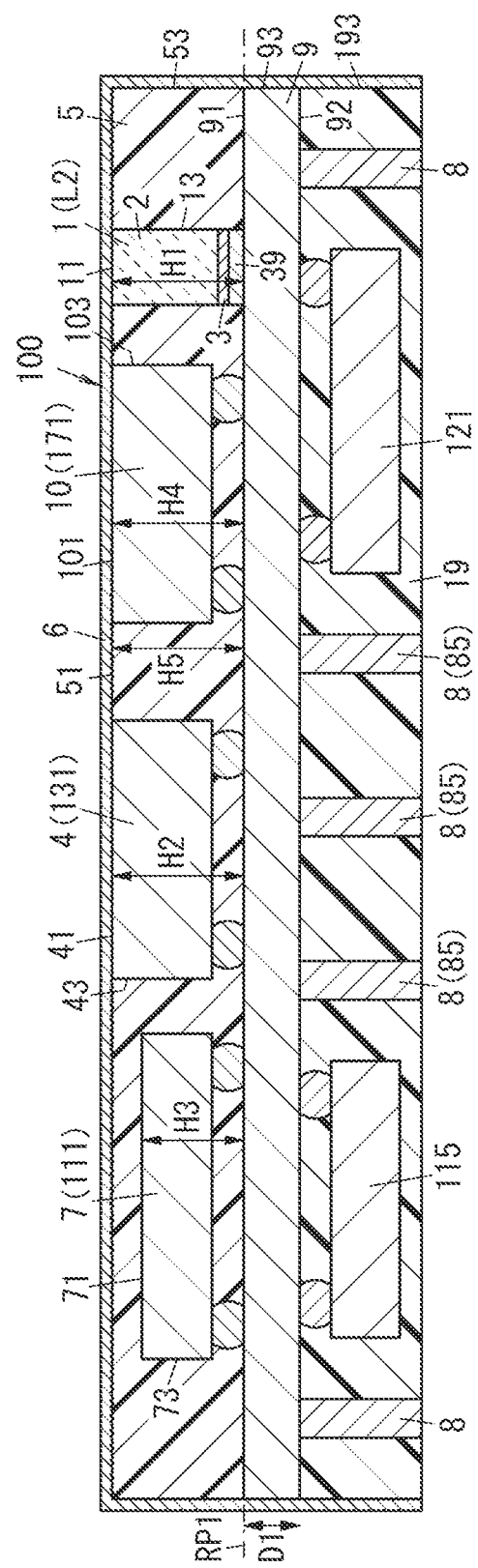
FIG. 2 illustrates the radio-frequency module.
Figure 3:
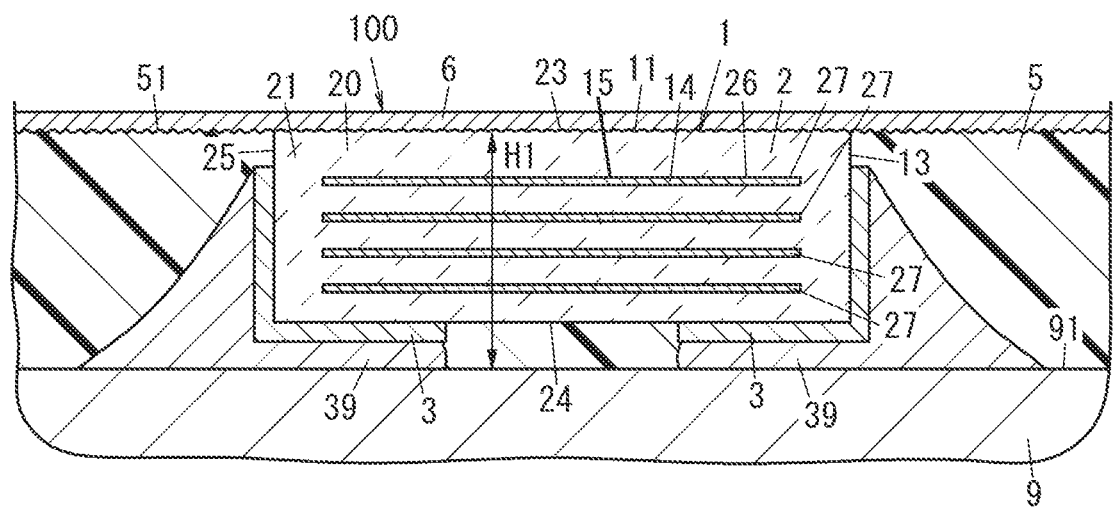
FIG. 3 illustrates the radio-frequency module.

A radio-frequency module 100 according to the first embodiment includes, for example, as illustrated in FIGS. 1 and 2, a mounting board 9, an electronic component 1, a resin layer 5 (see FIG. 2), and a conductive layer 6 (see FIG. 2). As illustrated in FIG. 2, the mounting board 9 has a first major surface 91 and a second major surface 92 that are opposite to each other. The electronic component 1 is mounted on the first major surface 91 of the mounting board 9. The resin layer 5 is provided on the first major surface 91 of the mounting board 9. The resin layer 5 covers an outer side surface 13 of the electronic component 1. The conductive layer 6 covers a major surface 51 of the resin layer 5, opposite to the mounting board 9 side, and a major surface 11 of the electronic component 1, opposite to the mounting board 9 side. The electronic component 1 includes, as illustrated in FIG. 3, an electronic component body 2 and a plurality of outer electrodes 3. The electronic component 1 is a surface mount device (SMD).

The radio-frequency module 100 according to the first embodiment further includes, as illustrated in FIGS. 1 and 2, as well as the electronic component 1 (hereinafter also referred to as the first electronic component 1), a second electronic component 4 mounted on the first major surface 91 of the mounting board 9. As illustrated in FIG. 2, the resin layer 5 covers an outer side surface 43 of the second electronic component 4. The conductive layer 6 covers a major surface 41 of the second electronic component 4, opposite to the mounting board 9 side.

The radio-frequency module 100 further includes, as illustrated in FIGS. 1 and 2, a third electronic component 7. The third electronic component 7 is mounted on the first major surface 91 of the mounting board 9. As illustrated in FIG. 2, the third electronic component 7 is lower in height than the first electronic component 1 and the second electronic component 4. The resin layer 5 covers the outer side surface 73 of the third electronic component 7. The resin layer 5 also covers a major surface 71 of the third electronic component 7, opposite to the mounting board 9 side.

The radio-frequency module 100 further includes, as illustrated in FIGS. 1 and 2, a fourth electronic component 10. The fourth electronic component 10 is mounted on the first major surface 91 of the mounting board 9. As illustrated in FIG. 2, the resin layer 5 covers an outer side surface 103 of the fourth electronic component 10. The conductive layer 6 covers a major surface 101 of the fourth electronic component 10, opposite to the mounting board 9 side.

Hereinafter, the radio-frequency module 100 and a communication device 300 according to the first embodiment will be more specifically described with reference to FIGS. 1 to 5.

Figure 5:
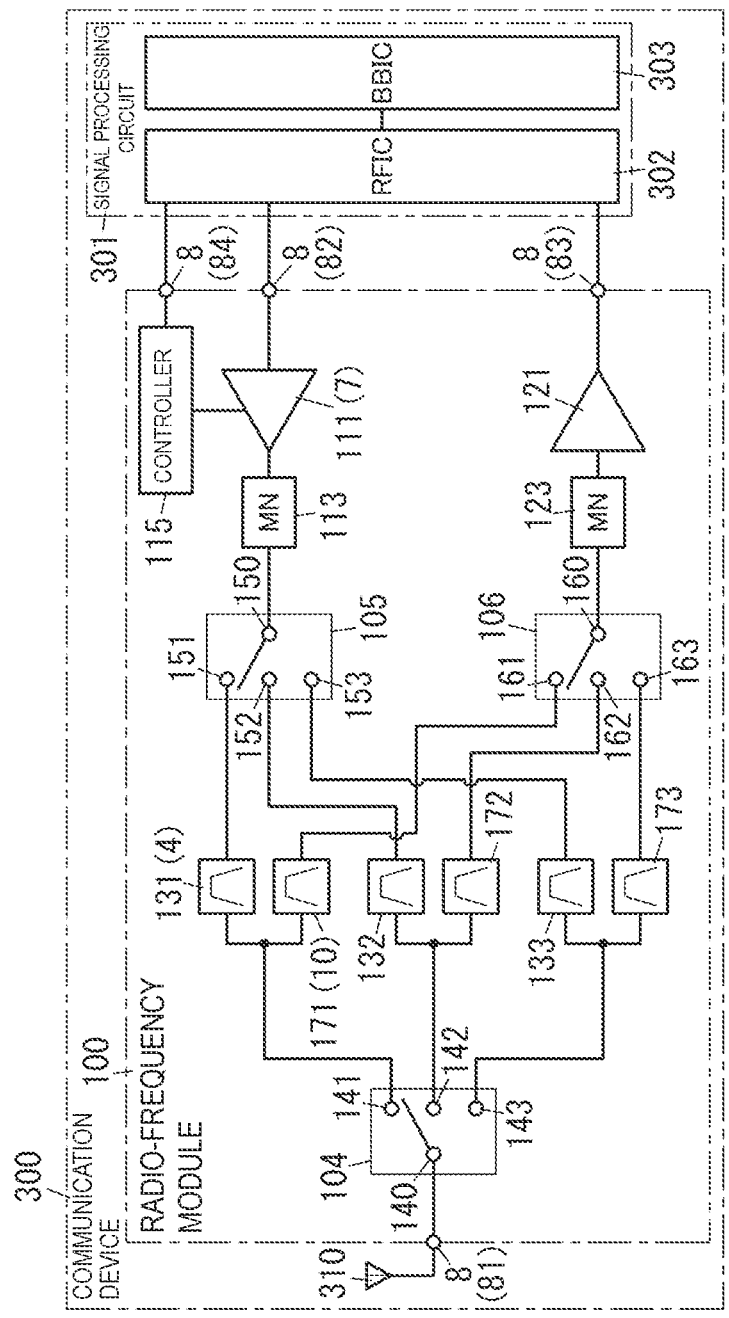
FIG. 5 is a circuit configuration diagram of a communication device including the radio-frequency module.

(1) Radio-Frequency Module and Communication Device (1.1) Circuit Configuration of Radio-Frequency Module and Communication Device The following describes a circuit configuration of the radio-frequency module 100 and the communication device 300 according to the first embodiment with reference to FIG. 5.

The radio-frequency module 100 is used in, for example, the communication device 300. The communication device 300 may be, for example, a mobile phone (for example, a smartphone). The communication device 300 is not limited to this example and may be, for example, a wearable device (for example, a smartwatch). The radio-frequency module 100 can support technology standards such as the fourth generation (4G) and fifth generation (5G) technology standards for cellular networks. Examples of the 4G standards include the 3rd Generation Partnership Project (3GPP) Long-Term Evolution (LTE) standard. Examples of the 5G standards include 5G New Radio (NR). The radio-frequency module 100 enables, for example, carrier aggregation and dual connectivity.

The radio-frequency module 100 is configured to, for example, amplify a transmit signal inputted from a signal processing circuit 301 and output the transmit signal to an antenna 310. The radio-frequency module 100 is also configured to amplify a receive signal inputted from the antenna 310 and output the receive signal to the signal processing circuit 301. The signal processing circuit 301 is not a constituent element of the radio-frequency module 100; the signal processing circuit 301 is a constituent element of the communication device 300 including the radio-frequency module 100. The radio-frequency module 100 according to the first embodiment is controlled by, for example, the signal processing circuit 301 included in the communication device 300. The communication device 300 includes the radio-frequency module 100 and the signal processing circuit 301. The communication device 300 further includes the antenna 310. The communication device 300 further includes a circuit board having the radio-frequency module 100. The circuit board is, for example, a printed-circuit board. The circuit board has a ground electrode to which a ground potential is supplied.

The signal processing circuit 301 includes, for example, a radio-frequency (RF) signal processing circuit 302 and a baseband signal processing circuit 303. The RF signal processing circuit 302, which is, for example, a radio frequency integrated circuit (RFIC), processes a radio-frequency signal. The RF signal processing circuit 302 processes by, for example, up-converting a radio-frequency signal (transmit signal) outputted by the baseband signal processing circuit 303 and outputs the processed radio-frequency signal. The RF signal processing circuit 302 also processes by, for example, down-converting a radio-frequency signal (receive signal) outputted by the radio-frequency module 100 and outputs the processed radio-frequency signal to the baseband signal processing circuit 303. The baseband signal processing circuit 303 is, for example, a baseband integrated circuit (BBIC). The baseband signal processing circuit 303 generates an in-phase signal and a quadrature signal from a baseband signal. The baseband signal is, for example, a sound signal or image signal inputted from outside. The baseband signal processing circuit 303 performs IQ modulation by adding an in-phase signal and a quadrature signal together and outputs a transmit signal. At this time, the transmit signal is a modulated signal (IQ signal) generated by amplitude modulating a carrier wave signal of a given frequency by a period longer than the period of the carrier wave signal. The receive signal processed by the baseband signal processing circuit 303 is used as, for example, an image signal for displaying an image, or a sound signal for talk by a user of the communication device 300. The radio-frequency module 100 transfers radio-frequency signals (receive and transmit signals) between the antenna 310 and the RF signal processing circuit 302 of the signal processing circuit 301.

The radio-frequency module 100 includes a plurality of (for example, three) transmit filters 131, 132, and 133. The radio-frequency module 100 includes a power amplifier 111 and an output matching network 113. The radio-frequency module 100 also includes a plurality of (for example, three) receive filters 171, 172, and 173. The radio-frequency module 100 also includes a low-noise amplifier 121 and an input matching network 123. The input matching network 123 includes, for example, one inductor. The radio-frequency module 100 further includes a controller 115. The radio-frequency module 100 also includes a first switch 104, a second switch 105, and a third switch 106. In the radio-frequency module 100, the inductor included in the input matching network 123 is implemented as the first electronic component 1. In the radio-frequency module 100, the transmit filter 131 is implemented as the second electronic component 4 described above. In the radio-frequency module 100, the power amplifier 111 is implemented as the third electronic component 7 described above. In the radio-frequency module 100, the receive filter 171 is implemented as the fourth electronic component 10 described above.

The radio-frequency module 100 also includes a plurality of external connection terminals 8. The external connection terminals 8 include an antenna terminal 81, a signal input terminal 82, a signal output terminal 83, a control terminal 84, and a plurality of ground terminals 85 (see FIG. 2). The ground terminals 85 are electrically coupled to the ground electrode of the circuit board included in the communication device 300 so that the ground potential is supplied to the external ground terminals 85.

The following more specifically describes the circuit configuration of the radio-frequency module 100 with reference to FIG. 5.

The transmit filters 131, 132, and 133 are transmit filters of different frequency ranges as pass bands. In the following, when the three transmit filters 131, 132, and 133 are distinctively described, the three transmit filters 131, 132, and 133 are also respectively referred to as the first transmit filter 131, the second transmit filter 132, and the third transmit filter 133.

The first transmit filter 131 is, for example, a filter configured such that the pass band is a transmit band of a first communication band. The second transmit filter 132 is, for example, a filter configured such that the pass band is a transmit band of a second communication band. The third transmit filter 133 is, for example, a filter configured such that the pass band is a transmit band of a third communication band. The first communication band corresponds to transmit signals passed by the first transmit filter 131. The second communication band corresponds to transmit signals passed by the second transmit filter 132. The third communication band corresponds to transmit signals passed by the third transmit filter 133. The first to third communication bands are communication bands of, for example, the 3GPP LTE standard or the 5G NR standard.

The power amplifier 111 has an input terminal and an output terminal. The power amplifier 111 amplifies a transmit signal inputted to the input terminal and outputs the transmit signal from the output terminal. The input terminal of the power amplifier 111 is coupled to the signal input terminal 82. The input terminal of the power amplifier 111 is coupled to the signal processing circuit 301 via the signal input terminal 82. The signal input terminal 82 is a terminal for inputting a radio-frequency signal (a transmit signal) from an external circuit (for example, the signal processing circuit 301) to the radio-frequency module 100. In the radio-frequency module 100, the output terminal of the power amplifier 111 is couplable to the first to third transmit filters 131 to 133 via the output matching network 113 and the second switch 105. The second switch 105 has a common terminal 150 and a plurality of (for example, three) selection terminals 151 to 153. In the radio-frequency module 100, the output terminal of the power amplifier 111 is coupled to the common terminal 150 of the second switch 105 via the output matching network 113, and the three selection terminals 151, 152, and 153 of the second switch 105 are coupled to the three transmit filters 131, 132, and 133 in one-to-one correspondence. The controller 115 controls the power amplifier 111.

The power amplifier 111 is, for example, a multistage amplifier including a driver stage amplifier and a final stage amplifier. In the power amplifier 111, an input terminal of the driver stage amplifier is coupled to the signal input terminal 82, an output terminal of the driver stage amplifier is coupled to an input terminal of the final stage amplifier, and an output terminal of the final stage amplifier is coupled to the output matching network 113. The power amplifier 111 is not necessarily a multistage amplifier; the power amplifier 111 may be, for example, an in-phase combining amplifier, differential combining amplifier, or Doherty amplifier.

The controller 115 controls the power amplifier 111 based on, for example, a control signal from the signal processing circuit 301. The controller 115 is coupled to, for example, the driver stage amplifier and the output-stage amplifier of the power amplifier 111. The controller 115 is coupled to the signal processing circuit 301 via a plurality of (for example, four) control terminals 84. The control terminals 84 are terminals for inputting a control signal from an external circuit (for example, the signal processing circuit 301) to the controller 115. Based on the control signal obtained via the control terminals 84, the controller 115 controls the power amplifier 111. The control signal obtained by the controller 115 via the control terminals 84 is a digital signal. The number of the control terminals 84 is, for example, four, but FIG. 5 illustrates only one control terminal 84. Based on the control signal from the signal processing circuit 301, the controller 115 supplies, for example, a first bias current to the driver stage amplifier and a second bias current to the output-stage amplifier.

The output matching network 113 is provided in a signal path between the output terminal of the power amplifier 111 and the common terminal 150 of the second switch 105. The output matching network 113 is a circuit for providing the impedance matching between the power amplifier 111 and the three transmit filters 131, 132, and 133. The output matching network 113 includes, for example, a first inductor L1 (see FIG. 1) coupled between the output terminal of the power amplifier 111 and the common terminal 150 of the second switch 105. The output matching network 113 may include, for example, a plurality of inductors and a plurality of capacitors.

The receive filters 171, 172, and 173 are receive filters of different frequency ranges as pass bands. In the following, when the three receive filters 171, 172, and 173 are distinctively described, the three receive filters 171, 172, and 173 are also respectively referred to as the first receive filter 171, the second receive filter 172, and the third receive filter 173.

The first receive filter 171 is, for example, a filter configured such that the pass band is a receive band of the first communication band. The second receive filter 172 is, for example, a filter configured such that the pass band is a receive band of the second communication band. The third receive filter 173 is, for example, a filter configured such that the pass band is a receive band of the third communication band. The first communication band corresponds to receive signals passed by the first receive filter 171. The second communication band corresponds to receive signals passed by the second receive filter 172. The third communication band corresponds to receive signals passed by the third receive filter 173. The first to third communication bands are communication bands of, for example, the 3GPP LTE standard or the 5G NR standard. In the radio-frequency module 100, the first transmit filter 131 and the first receive filter 171 form a first duplexer. In the radio-frequency module 100, the second transmit filter 132 and the second receive filter 172 form a second duplexer. In the radio-frequency module 100, the third transmit filter 133 and the receive filter 173 form a third duplexer.

The low-noise amplifier 121 has an input terminal and an output terminal. The low-noise amplifier 121 amplifies a receive signal inputted to the input terminal and outputs the receive signal from the output terminal. The input terminal of the low-noise amplifier 121 is coupled to a common terminal 160 of the third switch 106 via the input matching network 123. The output terminal of the low-noise amplifier 121 is coupled to the signal output terminal 83. The output terminal of the low-noise amplifier 121 is coupled to, for example, the signal processing circuit 301 via the signal output terminal 83. The signal output terminal 83 is a terminal for outputting a radio-frequency signal (a receive signal) from the low-noise amplifier 121 to an external circuit (for example, the signal processing circuit 301). In the radio-frequency module 100, the input terminal of the low-noise amplifier 121 is couplable to the first to third receive filters 171 to 173 via the input matching network 123 and the third switch 106. The third switch 106 has the common terminal 160 and a plurality of (for example, three) selection terminals 161 to 163. In the radio-frequency module 100, the input terminal of the low-noise amplifier 121 is coupled to the common terminal 160 of the third switch 106 via the input matching network 123, and the three selection terminals 161, 162, and 163 of the third switch 106 are coupled to the three receive filters 171, 172, and 173 in one-to-one correspondence.

The input matching network 123 is a circuit for providing the impedance matching between the low-noise amplifier 121 and the three receive filters 171, 172, and 173. The input matching network 123 includes, for example, a second inductor L2 (see FIG. 1) coupled between the input terminal of the low-noise amplifier 121 and the common terminal 160 of the third switch 106. The input matching network 123 may include, for example, a plurality of inductors and a plurality of capacitors. The radio-frequency module 100 may include a plurality of (three) input matching networks 123; in this case, the three input matching networks 123 may be provided between the low-noise amplifier 121 and the three respective receive filters 171, 172, and 173.

The first switch 104 has a common terminal 140 and a plurality of (for example, three) selection terminals 141 to 143. Of the first switch 104, the common terminal 140 is coupled to the antenna terminal 81. The radio-frequency module 100 is not necessarily configured such that the common terminal 140 is coupled to the antenna terminal 81 via no circuit element; the common terminal 140 may be coupled to the antenna terminal 81 via, for example, a low pass filter and a coupler. The selection terminal 141 is coupled to a node between an output terminal of the first transmit filter 131 and the input terminal of the first receive filter 171. The selection terminal 142 is coupled to a node between an output terminal of the second transmit filter 132 and an input terminal of the second receive filter 172. The selection terminal 143 is coupled to a node between an output terminal of the third transmit filter 133 and an input terminal of the third receive filter 173. The first switch 104 is, for example, a switch configured to establish the connection between the common terminal 140 and at least one or more of the three selection terminals 141 to 143. The first switch 104 is, for example, a switch configured to establish the connection between one terminal and another one terminal and between one terminal and a plurality of terminals.

The first switch 104 is controlled by, for example, the signal processing circuit 301. Based on a control signal from the RF signal processing circuit 302 of the signal processing circuit 301, the first switch 104 switches the connections between the common terminal 140 and the three selection terminals 141 to 143. The first switch 104 is, for example, a switch integrated circuit (IC).

The second switch 105 has the common terminal 150 and the plurality of (for example, three) selection terminals 151, 152, and 153. Of the second switch 105, the common terminal 150 is coupled to the output terminal of the power amplifier 111 via the output matching network 113. The selection terminal 151 is coupled to an input terminal of the first transmit filter 131. The selection terminal 152 is coupled to an input terminal of the second transmit filter 132. The selection terminal 153 is coupled to an input terminal of the third transmit filter 133. The second switch 105 is, for example, a switch configured to establish the connection between the common terminal 150 and at least one or more of the three selection terminals 151 to 153. The second switch 105 is, for example, a switch configured to establish the connection between one terminal and another one terminal and between one terminal and a plurality of terminals.

The second switch 105 is controlled by, for example, the signal processing circuit 301. Based on a control signal from the RF signal processing circuit 302 of the signal processing circuit 301, the second switch 105 switches the connections between the common terminal 150 and the three selection terminals 151 to 153. The second switch 105 is, for example, a switch IC.

The third switch 106 has the common terminal 160 and the plurality of (for example, three) selection terminals 161, 162, and 163. Of the third switch 106, the common terminal 160 is coupled to the input terminal of the low-noise amplifier 121 via the input matching network 123. The selection terminal 161 is coupled to an output terminal of the first receive filter 171. The selection terminal 162 is coupled to an output terminal of the second receive filter 172. The selection terminal 163 is coupled to an output terminal of the third receive filter 173. The third switch 106 is, for example, a switch configured to establish the connection between the common terminal 160 and at least one or more of the three selection terminals 161 to 163. The third switch 106 is, for example, a switch configured to establish the connection between one terminal and another one terminal and between one terminal and a plurality of terminals.

The third switch 106 is controlled by, for example, the signal processing circuit 301. Based on a control signal from the RF signal processing circuit 302 of the signal processing circuit 301, the third switch 106 switches the connections between the common terminal 160 and the three selection terminals 161 to 163. The third switch 106 is, for example, a switch IC.

(1.2) Structure of Radio-Frequency Module

The radio-frequency module 100 includes, as illustrated in FIG. 1, the mounting board 9 and the three transmit filters 131, 132, and 133. The radio-frequency module 100 also includes the power amplifier 111, the output matching network 113 (see FIG. 5), and the controller 115 (see FIG. 2). The radio-frequency module 100 also includes the three receive filters 171, 172, and 173, the low-noise amplifier 121, the input matching network 123 (see FIG. 5), the first switch 104 (see FIG. 5), the second switch 105 (see FIG. 5), and the third switch 106 (see FIG. 5). The radio-frequency module 100 also includes the external connection terminals 8 (see FIG. 2).

As illustrated in FIG. 2, the mounting board 9 has the first major surface 91 and the second major surface 92 that are opposite to each other in a thickness direction D1 of the mounting board 9. The mounting board 9 is, for example, a multilayer substrate including a plurality of dielectric layers and a plurality of conductive layers. The dielectric layers and the conductive layers are stacked in the thickness direction D1 of the mounting board 9. The conductive layers are shaped in particular patterns designed for the respective conductive layers. The conductive layers each include one or a plurality of conductive portions in one plane perpendicular to the thickness direction D1 of the mounting board 9. The conductive layers are made of, for example, copper. The conductive pattern layers include a ground layer. In the radio-frequency module 100, the ground terminals 85 are electrically coupled to the ground layer by, for example, via-conductors provided in the mounting board 9. The mounting board 9 is, for example, a low temperature co-fired ceramics (LTCC) substrate. The mounting board 9 is not limited to an LTCC substrate, and may be, for example, a printed-circuit board, high temperature co-fired ceramics (HTCC) substrate, or resin multilayer substrate.

The mounting board 9 is not limited to an LTCC substrate, and may be, for example, a wiring structure. The wiring structure is, for example, a multilayer structure. The multilayer structure includes at least one insulating layer and at least one conductive layer. The insulating layer is shaped in a particular pattern. When a plurality of insulating layers are included, the insulating layers are shaped in particular patterns designed for the respective insulating layers. The conductive layer is shaped in a particular pattern different from the particular pattern of the insulating layer. When a plurality of conductive layers are included, the conductive layers are shaped in particular patterns designed for the respective conductive layers. The conductive layer may include one or a plurality of redistribution portions. In the wiring structure, of two surfaces that are opposite to each other in the thickness direction of the multilayer structure, a first surface is the first major surface 91 of the mounting board 9, and a second surface is the second major surface 92 of the mounting board 9. The wiring structure may be, for example, an interposer. The interposer may be an interposer made of a silicon substrate or a substrate composed of multiple layers.

The first major surface 91 and the second major surface 92 of the mounting board 9 are away from each other in the thickness direction D1 of the mounting board 9. The first major surface 91 and the second major surface 92 of the mounting board 9 cross the thickness direction D1 of the mounting board 9. The first major surface 91 of the mounting board 9 is, for example, perpendicular to the thickness direction D1 of the mounting board 9. However, the first major surface 91 may include, for example, a side surface of a conductive portion as a surface not perpendicular to the thickness direction D1. The second major surface 92 of the mounting board 9 is, for example, perpendicular to the thickness direction D1 of the mounting board 9. However, the second major surface 92 may include, for example, a side surface of a conductive portion as a surface not perpendicular to the thickness direction D1. On the first major surface 91 and the second major surface 92 of the mounting board 9, fine irregularities, or a depressed or raised portion may be formed. For example, when a depressed portion is formed on the first major surface 91 of the mounting board 9, the inner surface of the depressed portion is included in the first major surface 91.

In the radio-frequency module 100 according to the first embodiment, circuit components of a first group are mounted on the first major surface 91 of the mounting board 9. The circuit components of the first group include, as illustrated in FIG. 1, the three transmit filters 131, 132, and 133, the power amplifier 111, the first inductor L1 of the output matching network 113, the three receive filters 171, 172, and 173, and the second inductor L2 of the input matching network 123. The expression "circuit components are mounted on the first major surface 91 of the mounting board 9" includes both the state in which circuit components are disposed on (mechanically coupled to) the first major surface 91 of the mounting board 9 and the state in which circuit components are electrically coupled to (appropriate conductive portions of) the mounting board 9. In the radio-frequency module 100, of the plurality of circuit components, circuit components of a second group are mounted on the second major surface 92 of the mounting board 9. The circuit components of the second group include the controller 115, the low-noise amplifier 121, the first switch 104, the second switch 105, and the third switch 106. The expression "circuit components are mounted on the second major surface 92 of the mounting board 9" includes both the state in which circuit components are disposed on (mechanically coupled to) the second major surface 92 of the mounting board 9 and the state in which circuit components are electrically coupled to (appropriate conductive portions of) the mounting board 9. In the radio-frequency module 100 according to the first embodiment, as described above, the second inductor L2, the transmit filter 131, the power amplifier 111, and the receive filter 171 are respectively implemented as the first electronic component 1, the second electronic component 4, the third electronic component 7, and the fourth electronic component 10.

The three transmit filters 131, 132, and 133 are, for example, ladder filters and each include a plurality of (for example, four) series arm resonators and a plurality of (for example, three) parallel arm resonators. The three transmit filters 131, 132, and 133 are, for example, acoustic wave filters. In the acoustic wave filter, a plurality of series arm resonators and a plurality of parallel arm resonators are individually formed by acoustic wave resonators. The acoustic wave filter is, for example, a surface acoustic wave filter using surface acoustic waves. In the surface acoustic wave filter, the plurality of series arm resonators and the plurality of parallel arm resonators are, for example, surface acoustic wave (SAW) resonators.

Figure 4:
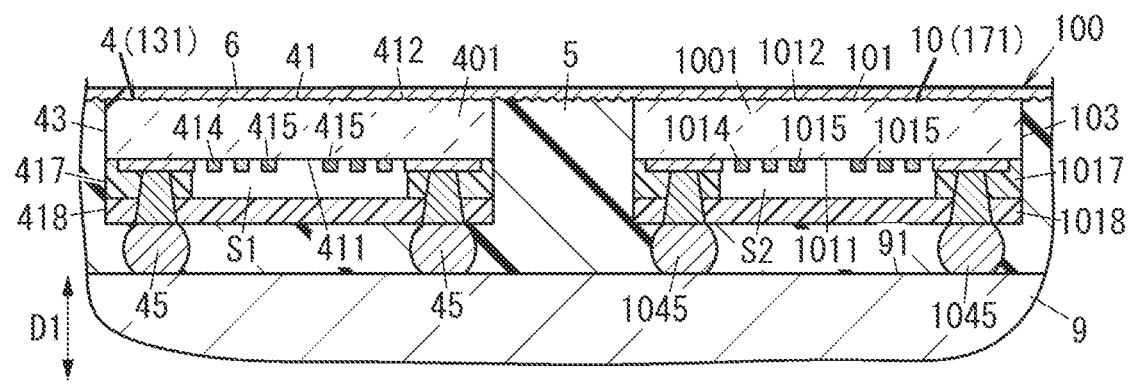
FIG. 4 is a partially enlarged sectional view of the radio-frequency module.

The three transmit filters 131, 132, and 133 are, as illustrated in FIG. 1, mounted on the first major surface 91 of the mounting board 9. When viewed in plan view in the thickness direction D1 of the mounting board 9, the contour of the three transmit filters 131, 132, and 133 is rectangular. The transmit filter 131, which is implemented as the second electronic component 4, includes, for example, a substrate 401 and a circuit portion 414 as illustrated in FIG. 4. The substrate 401 has a first major surface 411 and a second major surface 412 that are opposite to each other in the thickness direction of the substrate 401. The circuit portion 414 includes a plurality of interdigital transducer (IDT) electrodes 415 that are formed on the first major surface 411 of the substrate 401. The transmit filter 131 includes, as elements forming the package structure, a spacer layer 417, a cover member 418, and a plurality of outer electrodes 45.

When viewed in plan view in the thickness direction D1 of the mounting board 9, the transmit filter 131 is rectangular; but this is not to be interpreted as limiting, and the transmit filter 131 may be, for example, square. Of the transmit filter 131, the substrate 401 is a piezoelectric substrate; the substrate 401 is, for example, a lithium tantalate or a lithium niobate substrate.

The spacer layer 417 is disposed on the first major surface 411 side of the substrate 401. When viewed in plan view in the thickness direction of the substrate 401, the spacer layer 417 is provided around the IDT electrodes 415. When viewed in plan view in the thickness direction of the substrate 401, the spacer layer 417 is rectangular. The spacer layer 417 is electrically non-conductive. The material of the spacer layer 417 is, for example, epoxy resin or polyimide. The cover member 418 is shaped as a plate. The cover member 418 is disposed on the spacer layer 417 such that the cover member 418 faces the substrate 401 in the thickness direction of the substrate 401. In the thickness direction of the substrate 401, the cover member 418 overlaps the IDT electrodes 415, but the cover member 418 is spaced apart from the IDT electrodes 415 in the thickness direction of the substrate 401. The cover member 418 is electrically non-conductive. The material of the cover member 418 is, for example, epoxy resin or polyimide.

The transmit filter 131 has a space S1 enclosed by the substrate 401, the spacer layer 417, and the cover member 418. The space S1 is filled with gas. The gas is, for example, air or an inert gas (for example, nitrogen gas). The outer electrodes 45 are exposed from the cover member 418.

The structure of the second transmit filter 132 and the third transmit filter 133 is the same as the structure of the first transmit filter 131.

The power amplifier 111 is an IC chip for power amplification. The power amplifier 111 is mounted on the first major surface 91 of the mounting board 9 as illustrated in FIGS. 1 and 2. When viewed in plan view in the thickness direction D1 of the mounting board 9, the contour of the power amplifier 111 is rectangular. The power amplifier 111 is an IC chip including a substrate and a circuit portion; the substrate has a first major surface and a second major surface that are opposite to each other; the circuit portion is formed on the first major surface side of the substrate. The substrate is, for example, a gallium arsenide substrate. The circuit portion includes the driver stage amplifier coupled to the input terminal of the power amplifier 111 and the final stage amplifier coupled to the output end of the driver stage amplifier. The driver stage amplifier and the final stage amplifier each include a transistor for amplification. The transistor for amplification is, for example, a heterojunction bipolar transistor (HBT). The power amplifier 111 may include, for example, a direct-current blocking capacitor. The power amplifier 111 is flip-chip mounted on the first major surface 91 of the mounting board 9 such that, out of the first major surface and the second major surface of the substrate, the first major surface faces the first major surface 91 side of the mounting board 9. Thus, of the third electronic component 7, which is implemented by the power amplifier 111, the major surface 71 opposite to the mounting board 9 side of the third electronic component 7 is the second major surface of the substrate (a gallium arsenide substrate) included in the power amplifier 111. When viewed in plan view in the thickness direction D1 of the mounting board 9, the contour of the IC chip including the power amplifier 111 is rectangular. The substrate of the power amplifier 111 is not limited to a gallium arsenide substrate; the substrate of the power amplifier 111 may be, for example, a silicon substrate, silicon germanium substrate, or gallium nitride substrate. The transistor for amplification is not limited to an HBT; the transistor for amplification may be, for example, a bipolar transistor or field effect transistor (FET). The FET may be, for example, a metal-oxide-semiconductor field effect transistor (MOSFET).

The first inductor L1 included in the output matching network 113 is mounted on the first major surface 91 of the mounting board 9. When viewed in plan view in the thickness direction D1 of the mounting board 9, the contour of the first inductor L1 is rectangular. The first inductor L1 is a chip inductor. The output matching network 113 does not necessarily include only the first inductor L1; the output matching network 113 may include an inductor and a capacitor. When the power amplifier 111 is a differential combining amplifier, the output matching network 113 may include a transformer.

The controller 115 is mounted on the second major surface 92 of the mounting board 9 as illustrated in FIG. 2. When viewed in plan view in the thickness direction D1 of the mounting board 9, the contour of the controller 115 is rectangular. The controller 115 is, for example, an IC chip including a substrate and a circuit portion; the substrate has a first major surface and a second major surface that are opposite to each other; the circuit portion is formed on the first major surface side of the substrate. The substrate is, for example, a silicon substrate. The circuit portion includes a control circuit for controlling the power amplifier 111 based on a control signal from the signal processing circuit 301.

The three receive filters 171, 172, and 173 are, for example, ladder filters and each include a plurality of (for example, four) series arm resonators and a plurality of (for example, three) parallel arm resonators. The three receive filters 171, 172, and 173 are, for example, acoustic wave filters. In the acoustic wave filter, a plurality of series arm resonators and a plurality of parallel arm resonators are individually formed by acoustic wave resonators. The acoustic wave filter is, for example, a surface acoustic wave filter using surface acoustic waves. In the surface acoustic wave filter, the plurality of series arm resonators and the plurality of parallel arm resonators are, for example, SAW resonators.

The three receive filters 171, 172, and 173 are, as illustrated in FIG. 1, mounted on the first major surface 91 of the mounting board 9. When viewed in plan view in the thickness direction D1 of the mounting board 9, the contour of the three receive filters 171, 172, and 173 is rectangular. The receive filter 171, which is implemented as the fourth electronic component 10, includes, for example, a substrate 1001 and a circuit portion 1014 as illustrated in FIG. 4. The substrate 1001 has a first major surface 1011 and a second major surface 1012 that are opposite to each other in the thickness direction of the substrate 1001. The circuit portion 1014 includes a plurality of IDT electrodes 1015 formed on the first major surface 1011 of the substrate 1001. The receive filter 171 includes, as elements forming the package structure, a spacer layer 1017, a cover member 1018, and a plurality of outer electrodes 1045. When viewed in plan view in the thickness direction D1 of the mounting board 9, the receive filter 171 is rectangular; but this is not to be interpreted as limiting, and the receive filter 171 may be, for example, square. Of the receive filter 171, the substrate 1001 is a piezoelectric substrate; the substrate 1001 is, for example, a lithium tantalate or a lithium niobate substrate.

The spacer layer 1017 is disposed on the first major surface 1011 side of the substrate 1001. When viewed in plan view in the thickness direction of the substrate 1001, the spacer layer 1017 is provided around the IDT electrodes 1015. When viewed in plan view in the thickness direction of the substrate 1001, the spacer layer 1017 is rectangular. The spacer layer 1017 is electrically non-conductive. The material of the spacer layer 1017 is, for example, epoxy resin or polyimide. The cover member 1018 is shaped as a plate. The cover member 1018 is disposed on the spacer layer 1017 such that the cover member 1018 faces the substrate 1001 in the thickness direction of the substrate 1001. In the thickness direction of the substrate 1001, the cover member 1018 overlaps the IDT electrodes 1015, but the cover member 1018 is spaced apart from the IDT electrodes 1015 in the thickness direction of the substrate 1001. The cover member 1018 is electrically non-conductive. The material of the cover member 1018 is, for example, epoxy resin or polyimide. The receive filter 171 has a space S2 enclosed by the substrate 1001, the spacer layer 1017, and the cover member 1018. The space S2 is filled with gas. The gas is, for example, air or an inert gas (for example, nitrogen gas). The outer electrodes 1045 are exposed from the cover member 1018.

The structure of the second receive filter 172 and the third receive filter 173 is the same as the structure of the first receive filter 171.

The low-noise amplifier 121 is mounted on the second major surface 92 of the mounting board 9 as illustrated in FIG. 2. When viewed in plan view in the thickness direction D1 of the mounting board 9, the contour of the low-noise amplifier 121 is rectangular. The low-noise amplifier 121 is, for example, an IC chip including a substrate and a circuit portion; the substrate has a first major surface and a second major surface that are opposite to each other; the circuit portion is formed on the first major surface side of the substrate. The substrate is, for example, a silicon substrate. The circuit portion includes a FET as a transistor for amplification configured to amplify a receive signal inputted to the input terminal of the low-noise amplifier 121. The transistor for amplification is not limited to a FET; the transistor for amplification may be, for example, a bipolar transistor. The low-noise amplifier 121 is flip-chip mounted on the second major surface 92 of the mounting board 9 such that, out of the first major surface and the second major surface of the substrate, the first major surface faces the second major surface 92 side of the mounting board 9.

The second inductor L2 included in the input matching network 123 (see FIG. 5) is mounted on the first major surface 91 of the mounting board 9 as illustrated in FIGS. 1 and 2. When viewed in plan view in the thickness direction D1 of the mounting board 9, the contour of the second inductor L2 is rectangular. The second inductor L2 is a chip inductor. The input matching network 123 does not necessarily include only the second inductor L2; the input matching network 123 may include an inductor and a capacitor.

The first switch 104, the second switch 105, and the third switch 106, which are illustrated in FIG. 5, are mounted on the second major surface 92 of the mounting board 9. When viewed in plan view in the thickness direction D1 of the mounting board 9, the contour of the first switch 104, the second switch 105, and the third switch 106 is rectangular. Each of the first switch 104, the second switch 105, and the third switch 106 is, for example, an IC chip including a substrate and a circuit portion; the substrate has a first major surface and a second major surface that are opposite to each other; the circuit portion is formed on the first major surface side of the substrate. The substrate is, for example, a silicon substrate. The circuit portion includes a plurality of FETs as a plurality of switching elements. The switching elements are not limited to FETs; the switching elements may be, for example, bipolar transistors. The first switch 104, the second switch 105, and the third switch 106 are flip-chip mounted on the second major surface 92 of the mounting board 9 such that, out of the first major surface and the second major surface of the substrate, the first major surface faces the second major surface 92 side of the mounting board 9. In the radio-frequency module 100, two or three of the first switch 104, the second switch 105, and the third switch 106 may be included in one IC chip.

The external connection terminals 8 are arranged on the second major surface 92 of the mounting board 9 as illustrated in FIG. 2. The expression "the external connection terminals 8 are arranged on the second major surface 92 of the mounting board 9" includes both the state in which the external connection terminals 8 are mechanically coupled to the second major surface 92 of the mounting board 9 and the state in which the external connection terminals 8 are electrically coupled to (appropriate conductive portions of) the mounting board 9. The material of the external connection terminals 8 is, for example, metal (for example, copper or a copper alloy). The external connection terminals 8 are columnar electrodes. The columnar electrodes may be, for example, cylindrical electrodes. The external connection terminals 8 are joined to conductive portions in the mounting board 9 by, for example, solder; but this is not to be interpreted as limiting, and the external connection terminals 8 may be joined, for example, by conductive adhesive (for example, conductive paste) or directly to the conductor portions in the mounting board 9.

The external connection terminals 8 include, as illustrated in FIGS. 2 and 5, the antenna terminal 81, the signal input terminal 82, the signal output terminal 83, a plurality of control terminals 84 (only one control terminal 84 is illustrated in FIG. 5), and the ground terminals 85. The ground terminals 85 are electrically coupled to the ground layer of the mounting board 9. The ground layer serves as the circuit ground of the radio-frequency module 100. The circuit components of the radio-frequency module 100 include circuit components electrically coupled to the ground layer.

The resin layer 5 (hereinafter also referred to as the first resin layer 5) is disposed on the first major surface 91 of the mounting board 9 as illustrated in FIG. 2. The first resin layer 5 covers the outer side surfaces of the circuit components of the first group, which are mounted on the first major surface 91 of the mounting board 9, out of the plurality of circuit components. The first resin layer 5 covers the outer side surface 13 of the first electronic component 1 (the second inductor L2), the outer side surface 43 of the second electronic component 4 (the transmit filter 131), the outer side surface 73 of the third electronic component 7 (the power amplifier 111), and the outer side surface 103 of the fourth electronic component 10 (the receive filter 171). The first resin layer 5 contains a resin (for example, an epoxy resin). The first resin layer 5 may contain a filler as well as a resin.

The radio-frequency module 100 further includes a second resin layer 19 disposed on the second major surface 92 of the mounting board 9. The second resin layer 19 covers the outer side surfaces of the circuit components of the second group, which are mounted on the second major surface 92 of the mounting board 9, and the outer side surfaces of the external connection terminals 8. The second resin layer 19 contains a resin (for example, an epoxy resin). The second resin layer 19 may contain a filler as well as a resin. The material of the second resin layer 19 may be the same as or different from the material of the first resin layer 5.

The conductive layer 6 covers the first resin layer 5. The conductive layer 6 is electrically conductive. In the radio-frequency module 100, the conductive layer 6 is provided for electromagnetic shielding between the inside and outside of the radio-frequency module 100. The conductive layer 6 has a multilayer structure formed by stacking a plurality of metal layers; but this is not to be interpreted as limiting, and the conductive layer 6 may be formed by one metal layer. The metal layer contains one or more kinds of metals. The conductive layer 6 covers the major surface 51 of the first resin layer 5, opposite to the mounting board 9 side of the first resin layer 5, an outer side surface 53 of the first resin layer 5, and an outer side surface 93 of the mounting board 9. The conductive layer 6 also covers an outer side surface 193 of the second resin layer 19. The conductive layer 6 is in contact with at least a portion of an outer side surface of the ground layer included in the mounting board 9. As a result, the electric potential at the conductive layer 6 can be set at the same potential as the ground layer.

The conductive layer 6 covers the major surface 11 on the mounting board 9 side of the first electronic component 1, the major surface 41 on the mounting board 9 side of the second electronic component 4, and the major surface 101 on the mounting board 9 side of the fourth electronic component 10. The conductive layer 6 is in contact with the major surface 11 on the mounting board 9 side of the first electronic component 1, the major surface 41 on the mounting board 9 side of the second electronic component 4, and the major surface 101 on the mounting board 9 side of the fourth electronic component 10.

(1.3) Detailed Structure of Radio-Frequency Module

The first electronic component 1 includes, as illustrated in FIG. 3, the electronic component body 2 and the plurality of (for example, two) outer electrodes 3. The electronic component body 2 has a third major surface 23 and a fourth major surface 24 that are opposite to each other in the thickness direction D1 of the mounting board 9 (see FIG. 2) and an outer side surface 25. Of the electronic component body 2, the third major surface 23, the fourth major surface 24, and the outer side surface 25 are electrically non-conductive. Of the first electronic component 1, the third major surface 23 of the electronic component body 2 is the major surface 11 of the first electronic component 1; the third major surface 23 is in contact with the conductive layer 6. The outer electrodes 3 are arranged on the fourth major surface 24 of the electronic component body 2, but the outer electrodes 3 are not extended over the third major surface 23. The state in which the outer electrodes 3 are not extended over the third major surface 23 means that the outer electrodes 3 are not arranged on the third major surface 23 of the electronic component body 2. As a result, of the first electronic component 1, the outer electrodes 3 are not in contact with the conductive layer 6. The outer electrodes 3 are provided over both the fourth major surface 24 of the electronic component body 2 and the outer side surface 25 of the electronic component body 2. In other words, each outer electrode 3 includes a first portion provided on the fourth major surface 24 of the electronic component body 2, and a second portion provided on the outer side surface 25 of the electronic component body 2 and connected to the first portion. Each outer electrode 3 is not extended to an edge between the third major surface 23 of the electronic component body 2 and the outer side surface 25. The first electronic component 1 is an SMD. The outer electrodes 3 are joined to the mounting board 9 by joint portions 39 that are in one-to-one correspondence with the outer electrodes 3, so that the first electronic component 1 is surface-mounted on the mounting board 9. The material of the joint portions 39 is, for example, solder.

The material of the electronic component body 2 includes a ceramic. The third major surface 23 of the electronic component body 2 is a portion of a part made of a ceramic of the electronic component body 2. The inductor forming the first electronic component 1 (the second inductor L2) is a multilayer ceramic inductor. The electronic component body 2 includes a multilayer ceramic structure 20. The second inductor L2 includes a winding portion 26 coupled between the two outer electrodes 3. The winding portion 26 is provided inside the multilayer ceramic structure 20. The winding portion 26 includes a plurality of conductive layers 27 and via-conductors connecting two adjacent conductive layers 27 in the thickness direction D1 of the mounting board 9. The conductive layers 27 have, for example, a C-shape when viewed in the thickness direction D1 of the mounting board 9. In the first electronic component 1, the multilayer ceramic structure 20 forms an electrical insulating portion 21 of the electronic component body 2; the winding portion 26 and the two outer electrodes 3 form a circuit element 15 included in the first electronic component 1; the winding portion 26 forms a conductive portion 14 that is a portion of the circuit element 15, provided inside the electrical insulating portion 21 in the electronic component body 2. The winding axis of the second inductor L2 is the winding axis of the winding portion 26. The winding axis of the second inductor L2 extends in the thickness direction D1 of the mounting board 9 (see FIG. 2). The winding axis of the second inductor L2 is parallel to the thickness direction D1 of the mounting board 9; however, the winding axis of the second inductor L2 is not necessarily exactly parallel to the thickness direction D1 of the mounting board 9, and it is sufficient that the winding axis of the second inductor L2 be almost parallel to the thickness direction D1 of the mounting board 9. Almost parallel means that the angle between the winding axis and the thickness direction D1 is 10 degrees or less. The winding axis of the second inductor L2 is not necessarily parallel to the thickness direction D1 of the mounting board 9; the winding axis of the second inductor L2 may be parallel to one direction perpendicular to the thickness direction D1. In the electronic component 1 of the radio-frequency module 100 according to the first embodiment, the "electronic component body 2" is, of the electronic component 1, a portion excluding the outer electrodes 3; the "electronic component body 2" is a structure that includes the electrical insulating portion 21, which has the third major surface 23 forming the major surface 11 of the electronic component 1 and the outer side surface 25 forming a portion of the outer side surface 13 of the electronic component 1, and that also includes the winding portion 26 provided inside the electrical insulating portion 21. The size of the electronic component body 2 is almost the same as the size of the electronic component 1. The electrical insulating portion 21 is shaped as, for example, a parallelepiped. The electrical insulating portion 21 is formed by a plurality of dielectric layers (ceramic layers) that are stacked.

In the following, for ease of description, a reference plane RP1 refers to a plane perpendicular to the thickness direction D1 of the mounting board 9, including at least a portion of the first major surface 91 of the mounting board 9, as illustrated in FIG. 2. In the radio-frequency module 100, the first electronic component 1 is mounted on the first major surface 91 of the mounting board 9 such that the thickness direction of the first electronic component 1 coincides with the thickness direction D1 of the mounting board 9. The second electronic component 4 is mounted on the first major surface 91 of the mounting board 9 such that the thickness direction of the second electronic component 4 coincides with the thickness direction D1 of the mounting board 9. The major surface 11 of the first electronic component 1 and the major surface 41 of the second electronic component 4 are almost parallel to the reference plane RP1. In the radio-frequency module 100, a first distance H1 between the reference plane RP1 and the major surface 11 of the first electronic component 1 in the thickness direction D1 of the mounting board 9 is equal to a second distance H2 between the reference plane RP1 and the major surface 41 of the second electronic component 4 in the thickness direction D1 of the mounting board 9. The state in which the first distance H1 is equal to the second distance H2 is not limited to the state in which the first distance H1 is exactly equal to the second distance H2; it is sufficient that the second distance H2 be within the range of ±15% of the first distance H1; the second distance H2 is preferably within the range of ±10% of the first distance H1, and more preferably ±5% of the first distance H1.

In the radio-frequency module 100, the major surface 11 of the first electronic component 1 and the major surface 41 of the second electronic component 4 are rough surfaces. In other words, in the radio-frequency module 100, fine irregularities are formed in the major surface 11 of the first electronic component 1 and the major surface 41 of the second electronic component 4. The major surface 11 of the first electronic component 1 may be rougher than the outer side surface 13 of the first electronic component 1. The major surface 41 of the second electronic component 4 may be rougher than the outer side surface 43 of the second electronic component 4.

In the radio-frequency module 100, the first electronic component 1, the second electronic component 4, and the third electronic component 7 are mounted on the first major surface 91 of the mounting board 9. The third electronic component 7 is lower in height than the first electronic component 1 and the second electronic component 4. In other words, a third distance H3 between the reference plane RP1 and the major surface 71 of the third electronic component 7 in the thickness direction D1 of the mounting board 9 is shorter than both the first distance H1 and the second distance H2. The resin layer 5 covers the major surface 71 of the third electronic component 7. In the radio-frequency module 100, the maximum height roughness (Rz) of the major surface 11 of the first electronic component 1 and the maximum height roughness of the major surface 41 of the second electronic component 4 are greater than the maximum height roughness of the major surface 71 of the third electronic component 7. The value of the maximum height roughness of the major surface 11 of the first electronic component 1, the value of the maximum height roughness of the major surface 41 of the second electronic component 4, and the value of the maximum height roughness of the major surface 71 of the third electronic component 7 are measured on STEM images obtained when the sections of the radio-frequency module 100 are observed with a scanning transmission electron microscope (STEM). The maximum height roughness is the total of the maximum peak height and the maximum valley depth of each of the major surface 11 of the electronic component 1, the major surface 41 of the second electronic component 4, and the major surface 71 of the third electronic component 7 in STEM images. In other words, the maximum height roughness is the peak-to-valley value of irregularities of each of the major surface 11 of the electronic component 1, the major surface 41 of the second electronic component 4, and the major surface 71 of the third electronic component 7. The surface roughness of the major surface 11 of the electronic component 1 and the major surface 41 of the second electronic component is changeable, for example, in accordance with conditions for the process of making rough surfaces on the first electronic component 1 and the second electronic component 4 by processing such as grinding in the manufacturing processes for the radio-frequency module 100. To discuss the relative differences in the maximum height roughness, the value of maximum height roughness is not necessarily obtained based on STEM images; the value of maximum height roughness may be obtained based on, for example, scanning electron microscope (SEM) images.

In the radio-frequency module 100, a fourth distance H4 between the reference plane RP1 and the major surface 101 of the fourth electronic component 10 in the thickness direction D1 of the mounting board 9 is equal to the first distance H1. The state in which the fourth distance H4 is equal to the first distance H1 is not limited to the state in which the fourth distance H4 is exactly equal to the first distance H1; it is sufficient that the fourth distance H4 be within the range of ±15% of the first distance H1; the fourth distance H4 is preferably within the range of ±10% of the first distance H1, and more preferably ±5% of the first distance H1.

In the radio-frequency module 100, a fifth distance H5 between the reference plane RP1 and the major surface 51 of the resin layer 5 in the thickness direction D1 of the mounting board 9 is equal to the first distance H1. The state in which the fifth distance H5 is equal to the first distance H1 is not limited to the state in which the fifth distance H5 is exactly equal to the first distance H1; it is sufficient that the fifth distance H5 be within the range of ±15% of the first distance H1; the fifth distance H5 is preferably within the range of ±10% of the first distance H1, and more preferably ±5% of the first distance H1.

In the radio-frequency module 100, the major surface 11 of the first electronic component 1, the major surface 41 of the second electronic component 4, the major surface 101 of the fourth electronic component 10, and the major surface 51 of the resin layer 5 are flush with each other.

In the radio-frequency module 100, the first electronic component 1 is different from the second electronic component 4 with respect to the material of a portion in contact with the conductive layer 6. The material of the portion in contact with the conductive layer 6 of the first electronic component 1 is a ceramic. The material of the portion in contact with the conductive layer 6 of the second electronic component 4 is lithium tantalate or a lithium niobate. In the radio-frequency module 100 according to the first embodiment, the material of the portion in contact with the conductive layer 6 of the fourth electronic component 10 is the same as the material of the portion in contact with the conductive layer 6 of the second electronic component 4, but the fourth electronic component 10 may be different from the second electronic component 4 with respect to the material.

In the radio-frequency module 100 according to the first embodiment, for the purpose of improving the heat release performance, it is preferable that the conductive layer 6 be in contact with the entire major surfaces of the transmit filters 131, 132, and 133 on the side opposite to the mounting board 9 side.

(1.4) Layout of Circuit Components in Radio-Frequency Module

In the radio-frequency module 100, when viewed in plan view in the thickness direction D1 of the mounting board 9 (see FIG. 2), the first transmit filter 131, the second transmit filter 132, and the third transmit filter 133 are arranged parallel to the direction in which the power amplifier 111 and the first inductor L1 of the output matching network 113 (see FIG. 5) are arranged, in the order of the first transmit filter 131, the second transmit filter 132, and the third transmit filter 133 in the direction from the power amplifier 111 to the first inductor L1, as illustrated in FIG. 1.

In the radio-frequency module 100, when viewed in plan view in the thickness direction D1 of the mounting board 9, the first receive filter 171, the second receive filter 172, and the third receive filter 173 are arranged parallel to the direction in which the first transmit filter 131, the second transmit filter 132, and the third transmit filter 133 are arranged, in the order of the first receive filter 171, the second receive filter 172, and the third receive filter 173 in the direction from the first transmit filter 131 to the third transmit filter 133, as illustrated in FIG. 1.

When viewed in plan view in the thickness direction D1 of the mounting board 9, the second inductor L2 of the input matching network 123 (see FIG. 5) is adjacent to the receive filter 171 (see FIG. 1). The expression "the second inductor L42 is adjacent to the receive filter 171" means that when viewed in plan view in the thickness direction D1 of the mounting board 9, the second inductor L2 and the receive filter 171 are next to each other without any circuit component mounted on the first major surface 91 of the mounting board 9 between the second inductor L2 and the receive filter 171.

In the radio-frequency module 100, when viewed in plan view in the thickness direction D1 of the mounting board 9, the receive filter 171 overlaps the low-noise amplifier 121 (see FIG. 2). When viewed in plan view in the thickness direction D1 of the mounting board 9, a portion of the receive filter 171 coincides with a portion of the low-noise amplifier 121; this is not to be interpreted as limiting, and the entire portion of the receive filter 171 may coincide with the entire portion of the low-noise amplifier 121. The entire portion of the receive filter 171 may coincide with a portion of the low-noise amplifier 121, or the entire portion of the low-noise amplifier 121 may coincide with a portion of the receive filter 171.

In the radio-frequency module 100, when viewed in plan view in the thickness direction D1 of the mounting board 9, the power amplifier 111 does not overlap the low-noise amplifier 121 (see FIG. 2).

(1.5) Method of Manufacturing Radio-Frequency Module

As a method of manufacturing the radio-frequency module 100, a manufacturing method including, for example, a first step, a second step, a third step, a fourth step, and a fifth step is usable. The first step is a step of mounting a plurality of circuit components on the mounting board 9 and disposing the external connection terminals 8. The second step is a step of forming, on the first major surface 91 side with respect to the mounting board 9, a first resin material layer that covers portions including the circuit components of the first group and that is later made into the first resin layer 5 and also forming, on the second major surface 92 side with respect to the mounting board 9, a second resin material layer that is later made into the second resin layer 19. The third step is a step of grinding the first resin material layer from the major surface opposite to the mounting board 9 side of the first resin material layer and further grinding the first resin material layer, the first electronic component 1, the second electronic component 4, and the fourth electronic component 10 to form the first resin layer 5 and to make the first electronic component 1, the second electronic component 4, and the fourth electronic component 10 thinner. In the third step, by grinding the first electronic component 1, the second electronic component 4, and the fourth electronic component 10, the major surface 11 of the first electronic component 1, the major surface 41 of the second electronic component 4, and the major surface 101 of the fourth electronic component 10 are made rough (roughening). The fourth step is a step of grinding the second resin material layer from the major surface opposite to the mounting board 9 side of the second resin material layer to expose the ends of the external connection terminals 8 and subsequently grinding the second resin material layer and the external connection terminals 8, thereby forming the second resin layer 19. The fifth step is a step of forming the conductive layer 6 in contact with the major surface 51 of the first resin layer 5 and the major surfaces 11, 41, and 101 opposite to the mounting board 9 side of the first electronic component 1, the second electronic component 4, and the fourth electronic component 10 by, for example, sputtering, vapor deposition, or printing.

In the radio-frequency module 100 manufactured by the manufacturing method including the third step described above, the major surface 51 of the first resin layer 5 and the major surfaces 11, 41, and 101 opposite to the mounting board 9 side of the first electronic component 1, the second electronic component 4, and the fourth electronic component 10 are rough surfaces, and grinding marks can remain on the rough surfaces. In the method of manufacturing the radio-frequency module 100, for the purpose of not grinding portions constructing the circuit element 15 of the first electronic component 1 in the third step, the multilayer ceramic structure 20 of the electronic component body 2 before grinding is made thick. The thickness direction of the multilayer ceramic structure 20 is parallel to the thickness direction D1 of the mounting board 9. In the first electronic component 1 before grinding, the portions constructing the circuit element 15 (the winding portion 26 and the outer electrodes 3) are positioned on the mounting board 9 side in the thickness direction of the multilayer ceramic structure 20. In other words, the shortest distance between the winding portion 26 and the surface opposite to the mounting board 9 side of the multilayer ceramic structure 20 in the thickness direction of the multilayer ceramic structure 20 is longer than the shortest distance between the winding portion 26 and the surface on the mounting board 9 side of the multilayer ceramic structure 20 in the thickness direction of the multilayer ceramic structure 20. Similarly, the shortest distance between the outer electrodes 3 and the surface opposite to the mounting board 9 side of the multilayer ceramic structure 20 in the thickness direction of the multilayer ceramic structure 20 is longer than the shortest distance between the outer electrodes 3 and the surface on the mounting board 9 side of the multilayer ceramic structure 20 in the thickness direction of the multilayer ceramic structure 20.

(2) Effects (2.1) Radio-Frequency Module

The radio-frequency module 100 according to the first embodiment includes the mounting board 9, the electronic component 1, the resin layer 5, and the conductive layer 6. The mounting board 9 has the first major surface 91 and the second major surface 92 that are opposite to each other. The electronic component 1 is mounted on the first major surface 91 of the mounting board 9. The resin layer 5 is provided on the first major surface 91 of the mounting board 9. The resin layer 5 covers the outer side surface 13 of the electronic component 1. The conductive layer 6 covers the major surface 51 of the resin layer 5, opposite to the mounting board 9 side, and the major surface 11 of the electronic component 1, opposite to the mounting board 9 side. The electronic component 1 includes the electronic component body 2 and the outer electrodes 3. The electronic component body 2 includes the electrical insulating portion 21 and the conductive portion 14 provided inside the electrical insulating portion 21, forming at least a portion of the circuit element 15 of the electronic component 1. The electronic component body 2 has the third major surface 23 and the fourth major surface 24, which are opposite to each other, and the outer side surface 25. The outer electrodes 3 are provided at the electronic component body 2. Of the electronic component 1, the third major surface 23 of the electronic component body 2 is the major surface 11 of the electronic component 1; the third major surface 23 is in contact with the conductive layer 6. The outer electrodes 3 are arranged on the fourth major surface 24 of the electronic component body 2, but the outer electrodes 3 are not extended over the third major surface 23.

In the radio-frequency module 100 according to the first embodiment, the element value of the circuit element 15 included in the electronic component 1 can be increased. If a plurality of outer electrodes of an electronic component are extended to a third major surface of an electronic component body, the outer electrodes are in contact with a conductive layer; as a result, the outer electrodes in contact with the conductive layer are short-circuited with the conductive layer. Furthermore, when the above-described method of manufacturing a radio-frequency module is used, it is necessary to grind a portion of each outer electrode during the grinding in the third step, and as a result, the grinding becomes difficult. In the radio-frequency module 100 according to the first embodiment, the major surface 11 opposite to the mounting board 9 side of the electronic component 1 is in contact with the conductive layer 6, but the outer electrodes 3 are not in contact with the conductive layer 6. This structure reduces the height of the radio-frequency module 100 in the thickness direction D1 of the mounting board 9 and also increases the element value of the circuit element 15 included in the electronic component 1. In the radio-frequency module 100 according to the first embodiment, the element value of the circuit element 15 included in the electronic component 1 is inductance. In the radio-frequency module 100 according to the first embodiment, the third major surface 23 of the electronic component body 2 forms the major surface 11 of the electronic component 1, and the third major surface 23 is in contact with the conductive layer 6. This structure enables the electrical insulating portion 21 to be made thicker than the case where the electronic component 1 is not in contact with the conductive layer 6. As a result, in the radio-frequency module 100 according to the first embodiment, it is possible to increase the turns of the winding portion 26, which is the conductive portion 14 forming a portion of the circuit element 15 (it is possible to increase the number of conductive layers 27 and via-conductors included in the winding portion 26), and consequently increase the inductance of the circuit element 15.

(2.2) Communication Device

The communication device 300 according to the first embodiment includes the signal processing circuit 301 and the radio-frequency module 100. The signal processing circuit 301 is coupled to the radio-frequency module 100.

Because the communication device 300 according to the first embodiment includes the radio-frequency module 100, the element value of the circuit element 15 included in the electronic component 1 can be increased.

A plurality of electronic components constituting the signal processing circuit 301 may be mounted on, for example, the circuit board described above, or a circuit board (a second circuit board) different from the circuit board having the radio-frequency module 100 (a first circuit board).

(3) Modifications of Radio-Frequency Module (3.1) First Modification

Figure 6:
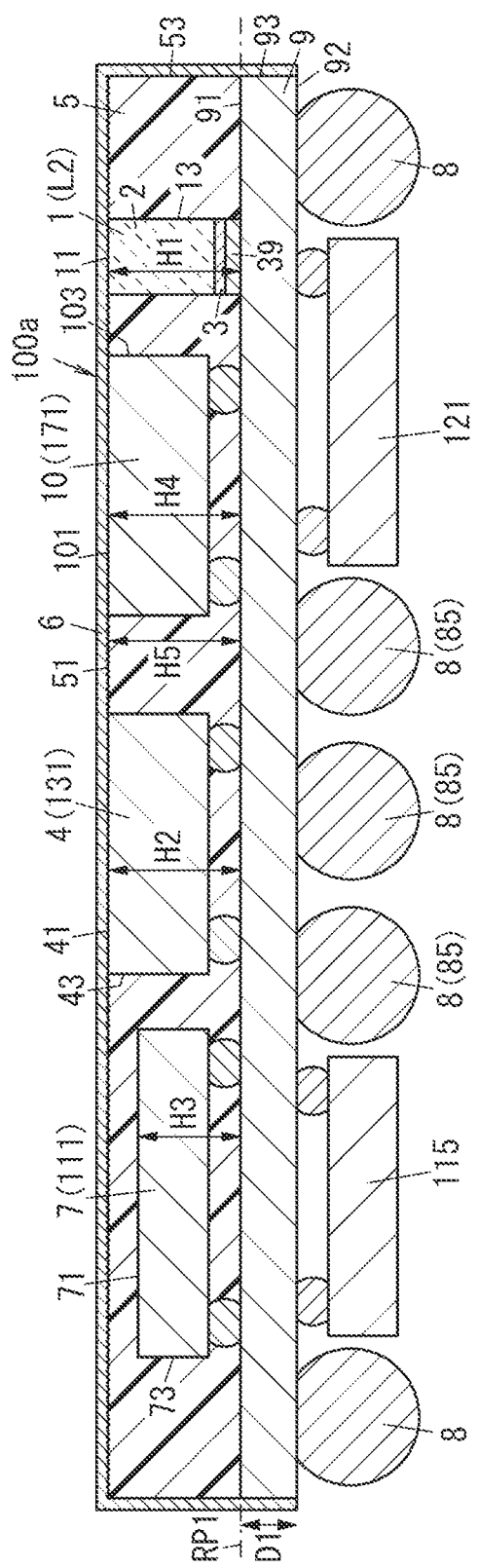
FIG. 6 is a sectional view of a radio-frequency module according to a first modification of the first embodiment.

A radio-frequency module 100a according to a first modification of the first embodiment will be described with reference to FIG. 6. Regarding the radio-frequency module 100a according to the first modification, the same reference characters are assigned to the same constituent elements as the radio-frequency module 100 according to the first embodiment, and descriptions thereof are not repeated.

The radio-frequency module 100a according to the first modification differs from the radio-frequency module 100 according to the first embodiment in that the external connection terminals 8 are ball bumps. The radio-frequency module 100a according to the first modification differs from the radio-frequency module 100 according to the first embodiment also in that the second resin layer 19 (see FIG. 2) of the radio-frequency module 100 according to the first embodiment is not included. The radio-frequency module 100a according to the first modification may include an underfill deposited in the gap between the circuit components of the second group (for example, the controller 115 and the low-noise amplifier 121) mounted on the second major surface 92 of the mounting board 9 and the second major surface 92 of the mounting board 9.

The material of the ball bumps respectively forming the external connection terminals 8 is, for example, gold, copper, or solder.

The external connection terminals 8 may include both the external connection terminals 8 formed by ball bumps and the external connection terminals 8 formed by columnar electrodes.

(3.2) Second Modification

Figure 7:
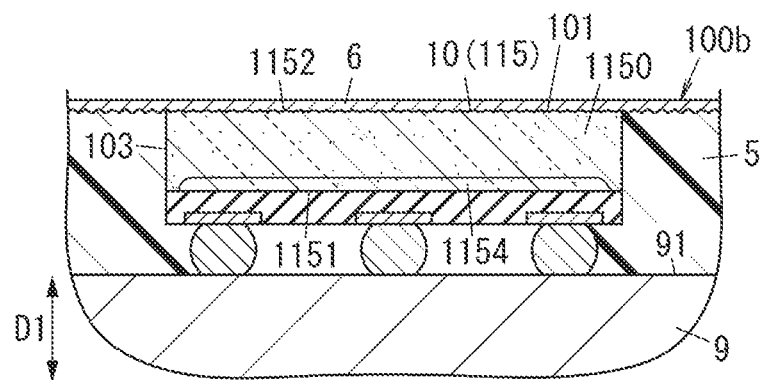
FIG. 7 is a partially enlarged sectional view of a radio-frequency module according to a second modification of the first embodiment.

A radio-frequency module 100b according to a second modification of the first embodiment will be described with reference to FIG. 7. Regarding the radio-frequency module 100b according to the second modification, the same reference characters are assigned to the same constituent elements as the radio-frequency module 100 according to the first embodiment, and descriptions thereof are not repeated.

The radio-frequency module 100b according to the second modification differs from the radio-frequency module 100 according to the first embodiment in that the controller 115 is mounted on the first major surface 91 of the mounting board 9.

In the radio-frequency module 100b according to the second modification, the controller 115 is implemented as the fourth electronic component 10. The resin layer 5 covers the outer side surface 103 of the fourth electronic component 10. The conductive layer 6 covers a major surface 101 of the fourth electronic component 10, opposite to the mounting board 9 side. Regarding the fourth electronic component 10, the major surface 101 of the fourth electronic component 10 is in contact with the conductive layer 6.

The controller 115 is an IC chip including a substrate 1150 and a circuit portion 1154. The substrate 1150 has a first major surface 1151 and a second major surface 1152 that are opposite to each other. The circuit portion 1154 is formed on the first major surface 1151 side of the substrate 1150. The substrate 1150 is, for example, a silicon substrate. The circuit portion 1154 includes a control circuit for controlling the power amplifier 111 based on a control signal from the signal processing circuit 301.

In the radio-frequency module 100b according to the second modification, the first electronic component 1 (see FIG. 2), the second electronic component 4 (see FIG. 2), and the fourth electronic component 10 are different from each other with respect to the material of a portion in contact with the conductive layer 6. The material of the portion in contact with the conductive layer 6 of the first electronic component 1 is a ceramic. The material of the portion in contact with the conductive layer 6 of the second electronic component 4 is a piezoelectric material (lithium tantalate or lithium niobate). The material of the portion in contact with the conductive layer 6 of the fourth electronic component 10 is silicon.

(3.3) Third Modification

A radio-frequency module 100c according to a third modification of the first embodiment will be described with reference to FIGS. 8 to 11. Regarding the radio-frequency module 100c according to the third modification, the same reference characters are assigned to the same constituent elements as the radio-frequency module 100 according to the first embodiment, and descriptions thereof are not repeated.

Figure 8:
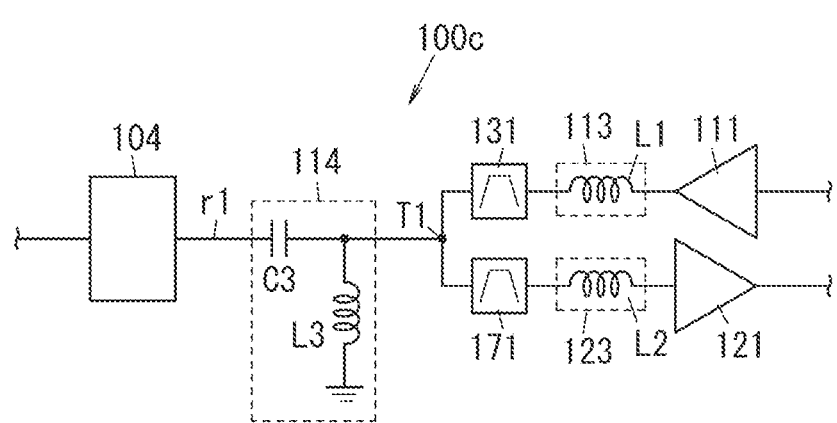
FIG. 8 is a circuit diagram of a radio-frequency module according to a third modification of the first embodiment.

The radio-frequency module 100c according to the third modification differs from the radio-frequency module 100 according to the first embodiment in that a matching network 114 is coupled between the first switch 104 and a node between the output terminal of the transmit filter 131 and the input terminal of the receive filter 171, as illustrated in FIG. 8.

The matching network 114 is a circuit for providing the impedance matching between the transmit filter 131 and the receive filter 171, and the first switch 104. The matching network 114 includes a capacitor C3 and a third inductor L3, the capacitor C3 being provided in a signal path r1 between the first switch 104 and a node T1 which connects the output terminal of the transmit filter 131 and the input terminal of the receive filter 171, and the third inductor L3 being coupled between the signal path r1 and the ground.

Figure 9:
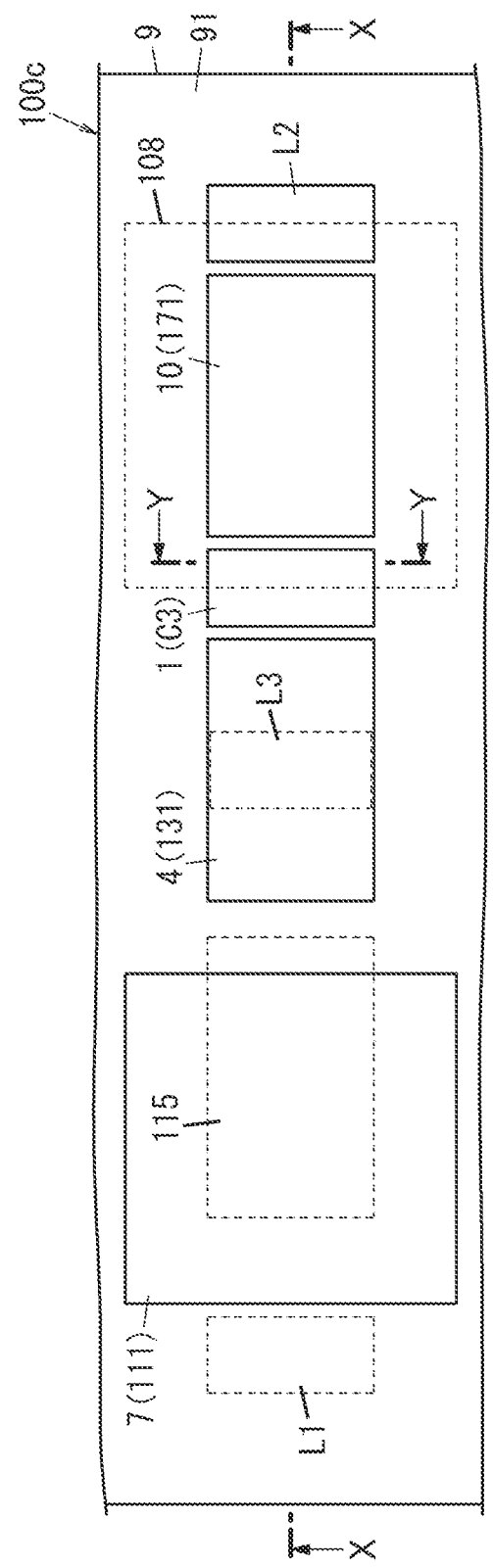
FIG. 9 is a partially cutaway plan view of the radio-frequency module.
Figure 10:
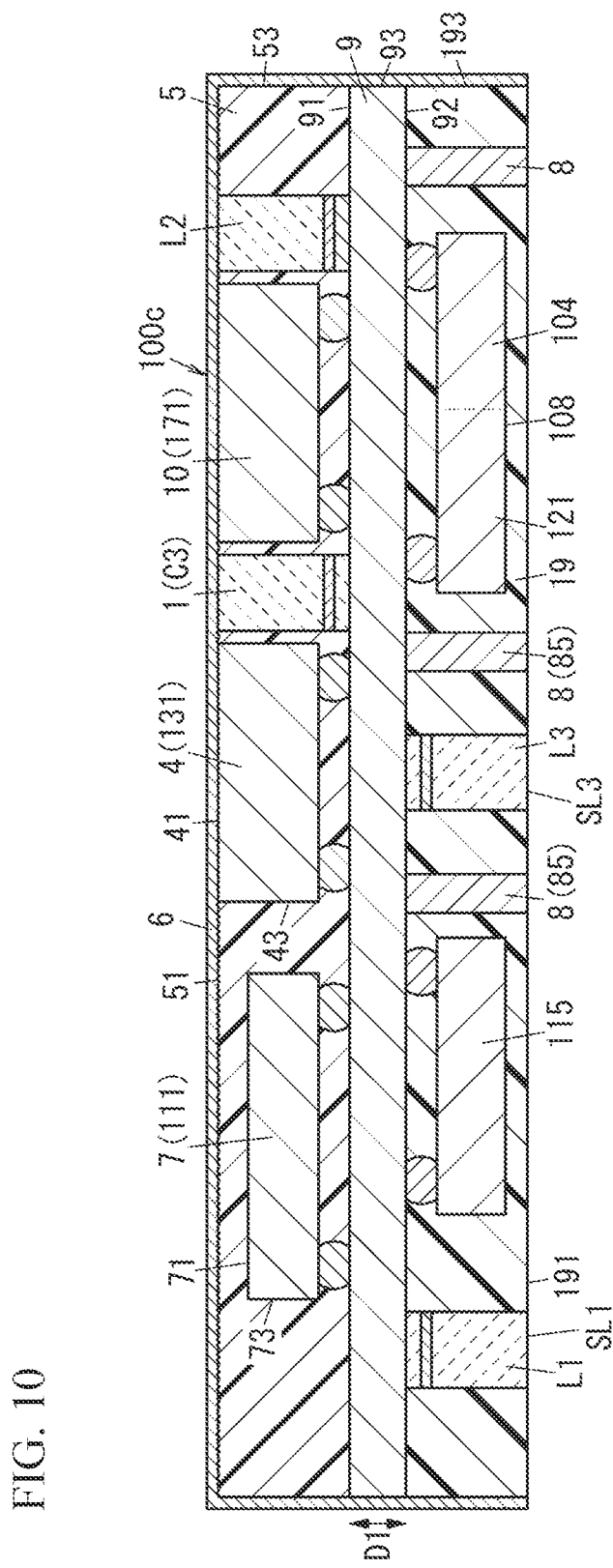
FIG. 10 illustrates the radio-frequency module.

In the radio-frequency module 100c according to the third modification, as illustrated in FIGS. 9 and 10, the first inductor L1 of the output matching network 113 is mounted on the second major surface 92 of the mounting board 9. In the radio-frequency module 100c, the second inductor L2 of the input matching network 123 is mounted on the first major surface 91 of the mounting board 9. In the radio-frequency module 100c, the capacitor C3 of the matching network 114 is mounted on the first major surface 91 of the mounting board 9. In the radio-frequency module 100c, the third inductor L3 of the matching network 114 is mounted on the second major surface 92 of the mounting board 9. When viewed in plan view in the thickness direction D1 of the mounting board 9, the capacitor C3 is positioned between the transmit filter 131 and the receive filter 171. In the radio-frequency module 100c according to the third modification, major surfaces SL1 and SL3 opposite to the mounting board 9 side of the first inductor L1 and the third inductor L3 are exposed at a major surface 191 opposite to the mounting board 9 side of the second resin layer 19.

Figure 11:
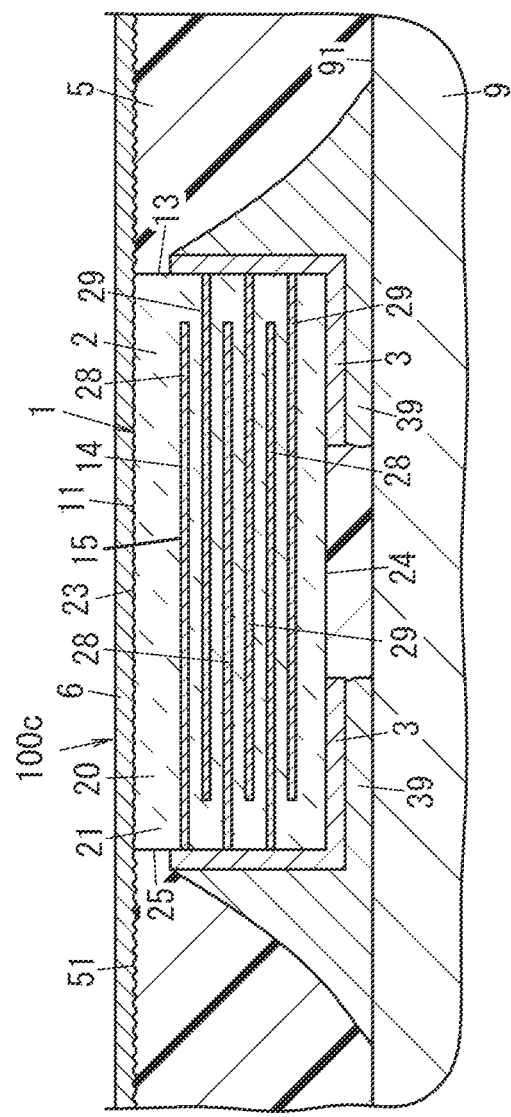
FIG. 11 illustrates the radio-frequency module.

In the radio-frequency module 100c according to the third modification, the capacitor C3 is implemented as the first electronic component 1. The first electronic component 1 includes, as illustrated in FIG. 11, the electronic component body 2 and the plurality of (for example, two) outer electrodes 3. The electronic component body 2 has a third major surface 23 and a fourth major surface 24 that are opposite to each other in the thickness direction D1 of the mounting board 9 and an outer side surface 25. Of the electronic component body 2, the third major surface 23, the fourth major surface 24, and the outer side surface 25 are electrically non-conductive. Of the first electronic component 1, the third major surface 23 of the electronic component body 2 is the major surface 11 of the first electronic component 1; the third major surface 23 is in contact with the conductive layer 6. The outer electrodes 3 are arranged on the fourth major surface 24 of the electronic component body 2, but the outer electrodes 3 are not extended over the third major surface 23. As a result, of the first electronic component 1, the outer electrodes 3 are not in contact with the conductive layer 6. The outer electrodes 3 are provided over both the fourth major surface 24 of the electronic component body 2 and the outer side surface 25 of the electronic component body 2. Each outer electrode 3 is not extended to an edge between the third major surface 23 of the electronic component body 2 and the outer side surface 25.

The material of the electronic component body 2 includes a ceramic. The third major surface 23 of the electronic component body 2 is a portion of a part made of a ceramic of the electronic component body 2. The capacitor C3 implemented as the first electronic component 1 is a multilayer ceramic capacitor. The electronic component body 2 includes the multilayer ceramic structure 20, a plurality of first inner electrodes 28, and a plurality of second inner electrodes 29. In the capacitor C3, the first inner electrodes 28 are coupled to one outer electrode 3 of the two outer electrodes 3, and the second inner electrodes 29 are coupled to the other outer electrode 3 of the two outer electrodes 3. In the capacitor C3, the first inner electrodes 28 and the second inner electrodes 29 are arranged one by one in an alternating manner in the thickness direction D1 of the mounting board 9. In the first electronic component 1, the multilayer ceramic structure 20 forms the electrical insulating portion 21 of the electronic component body 2; the first inner electrodes 28 and the second inner electrodes 29, and the two outer electrodes 3 form the circuit element 15 included in the first electronic component 1. The element value of the circuit element 15 is capacitance. In the first electronic component 1, the multilayer ceramic structure 20 forms the electrical insulating portion 21 of the electronic component body 2; the first inner electrodes 28 and the second inner electrodes 29, and the two outer electrodes 3 form the circuit element 15 included in the first electronic component 1; the first inner electrodes 28 and the second inner electrodes 29 form the conductive portion 14 that is a portion of the circuit element 15, provided inside the electrical insulating portion 21 in the electronic component body 2. In the electronic component 1 of the radio-frequency module 100c according to the third modification, the "electronic component body 2" is, of the electronic component 1, a portion excluding the outer electrodes 3; the "electronic component body 2" is a structure that includes the electrical insulating portion 21, which has the third major surface 23 forming the major surface 11 of the electronic component 1 and the outer side surface 25 forming a portion of the outer side surface 13 of the electronic component 1, and that also includes the first inner electrodes 28 and the second inner electrodes 29 provided inside the electrical insulating portion 21. The size of the electronic component body 2 is almost the same as the size of the electronic component 1. The electrical insulating portion 21 is shaped as, for example, a parallelepiped. The electrical insulating portion 21 is formed by a plurality of dielectric layers (ceramic layers) that are stacked.

The radio-frequency module 100c according to the third modification also includes an IC chip 108 (see FIGS. 9 and 10) including the low-noise amplifier 121 and the first switch 104. The IC chip 108 is mounted on the second major surface 92 of the mounting board 9 as illustrated in FIG. 10. Although not illustrated in the drawings, a capacitor functioning as a bypass capacitor provided in a path for supplying power to elements including the low-noise amplifier 121 is mounted on the second major surface 92 of the mounting board 9. In the structure of the third modification illustrated in FIG. 10, the major surfaces opposite to the mounting board 9 side of elements including the first inductor L1, the third inductor L3, and the bypass capacitor mounted on the second major surface 92 of the mounting board 9, in other words, SMDs mounted on the second major surface 92 of the mounting board 9 are flush with the major surface 191 opposite to the mounting board 9 side of the second resin layer 19; the major surfaces opposite to the mounting board 9 side of the SMDs are exposed at the major surface 191 of the second resin layer 19. This structure reduces the height of the radio-frequency module 100c. During the manufacturing process of the radio-frequency module 100c, the second resin layer 19, the SMDs disposed on the second major surface 92 of the mounting board 9, and the external connection terminals 8 are ground from the side opposite to the mounting board 9 side, and as a result, the height of the radio-frequency module 100c is further reduced.

When viewed in plan view in the thickness direction D1 of the mounting board 9, the receive filter 171 overlaps the IC chip 108 as illustrated in FIG. 9. When viewed in plan view in the thickness direction D1 of the mounting board 9, the entire portion of the receive filter 171 coincides with a portion of the IC chip 108; this is not to be interpreted as limiting, and the entire portion of the receive filter 171 may coincide with the entire portion of the IC chip 108. A portion of the receive filter 171 may coincide with the entire portion of the IC chip 108, a portion of the receive filter 171 may coincide with a portion of the IC chip 108. In the radio-frequency module 100c according to the third modification, the three receive filters 171, 172, and 173 may overlap the IC chip 108.

In the radio-frequency module 100c, when viewed in plan view in the thickness direction D1 of the mounting board 9, the transmit filter 131 does not overlap the IC chip 108 as illustrated in FIG. 9.

In the radio-frequency module 100c according to the third modification, as with the radio-frequency module 100 according to the first embodiment, the third major surface 23 of the electronic component body 2 of the electronic component 1 forms the major surface 11 of the electronic component 1, and the third major surface 23 is in contact with the conductive layer 6. The outer electrodes 3 are arranged on the fourth major surface 24 of the electronic component body 2, but the outer electrodes 3 are not extended over the third major surface 23. As a result, in the radio-frequency module 100c according to the third modification, the element value (capacitance) of the circuit element 15 included in the electronic component 1 can be increased. In the radio-frequency module 100c according to the third modification, as with the radio-frequency module 100 according to the first embodiment, the third major surface 23 of the electronic component body 2 forms the major surface 11 of the electronic component 1, and the third major surface 23 is in contact with the conductive layer 6. This structure enables the electrical insulating portion 21 to be made thicker than the case where the electronic component 1 is not in contact with the conductive layer 6. As a result, in the radio-frequency module 100c according to the third modification, it is possible to increase the number of first inner electrodes 28 and second inner electrodes 29 included in the conductive portion 14 forming a portion of the circuit element 15 (it is possible to increase the number of pairs of the first inner electrode 28 and the second inner electrode 29), and consequently increase the capacitance of the circuit element 15.

Second Embodiment

Figure 12:
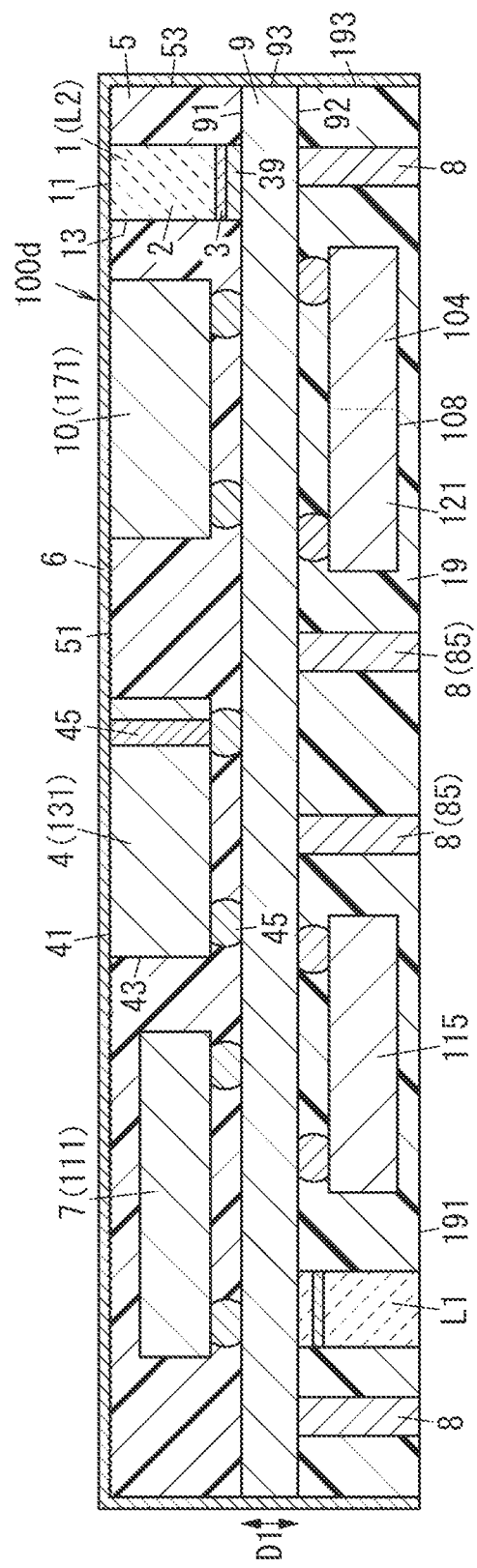
FIG. 12 is a sectional view of a radio-frequency module according to a second embodiment.

A radio-frequency module 100d according to a second embodiment will be described with reference to FIGS. 12 and 13. Regarding the radio-frequency module 100d according to the second embodiment, the same reference characters are assigned to the same constituent elements as the radio-frequency module 100 according to the first embodiment, and descriptions thereof are not repeated. The radio-frequency module 100d according to the second embodiment includes, as with the radio-frequency module 100c according to the third modification of the first embodiment, the IC chip 108 including the low-noise amplifier 121 and the first switch 104. The IC chip 108 is mounted on the second major surface 92 of the mounting board 9 as illustrated in FIG. 12.

In the radio-frequency module 100d according to the second embodiment, one or some of the outer electrodes 45 of the second electronic component 4 are in contact with the conductive layer 6. The outer electrode 45 in contact with the conductive layer 6 is extended through the second electronic component 4 in the thickness direction of the second electronic component 4.

Figure 13:
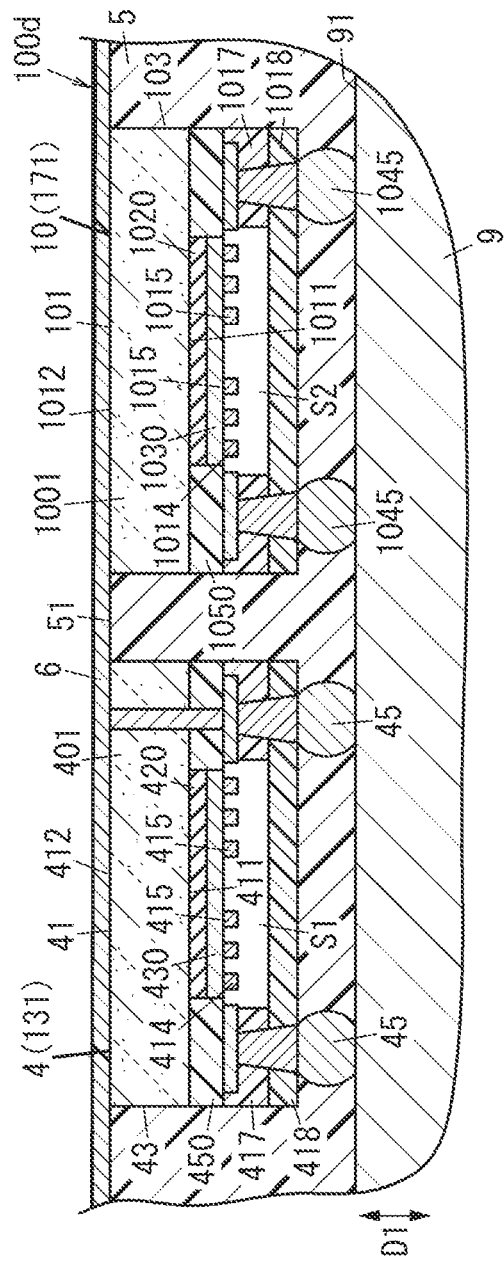
FIG. 13 is a partially enlarged sectional view of the radio-frequency module.

In the radio-frequency module 100d according to the second embodiment, as illustrated in FIG. 13, the structure of the transmit filter 131 and the structure of the receive filter 171 are different from the structure of the transmit filter 131 and the structure of the receive filter 171 in the radio-frequency module 100 according to the first embodiment.

In the transmit filter 131 of the radio-frequency module 100d according to the second embodiment, the substrate 401 is a silicon substrate. The transmit filter 131 includes a low acoustic velocity film 420 provided on the first major surface 411 of the substrate 401 and a piezoelectric layer 430 provided on the low acoustic velocity film 420. In the transmit filter 131, the substrate 401, the low acoustic velocity film 420, and the piezoelectric layer 430 form a piezoelectric substrate. In the transmit filter 131, the circuit portion 414 including the IDT electrodes 415 is formed on the piezoelectric layer 430.

When viewed in plan view in the thickness direction of the substrate 401, the low acoustic velocity film 420 is positioned away from the outer periphery of the substrate 401. The transmit filter 131 further includes an insulating layer 450 that covers, of the first major surface 411 of the substrate 401, an area not covered with the low acoustic velocity film 420. The insulating layer 450 is electrically non-conductive. The insulating layer 450 is formed along the outer edges of the substrate 401 on the first major surface 411 of the substrate 401. The insulating layer 450 is provided around the IDT electrodes 415. When viewed in plan view in the thickness direction of the substrate 401, the insulating layer 450 is shaped as a frame (for example, a rectangular frame). A portion of the insulating layer 450 overlaps the outer periphery of the piezoelectric layer 430 in the thickness direction of the substrate 401. The insulating layer 450 covers the outer side surface of the piezoelectric layer 430 and the outer side surface of the low acoustic velocity film 420. The material of the insulating layer 450 is, for example, epoxy resin or polyimide.

The material of the piezoelectric layer 430 is, for example, lithium niobate or lithium tantalate. The low acoustic velocity film 420 is configured such that the velocity of a bulk wave propagating in the low acoustic velocity film 420 is lower than the velocity of a bulk wave propagating in the piezoelectric layer 430. The material of the low acoustic velocity film 420 is, for example, silicon oxide, but not limited to silicon oxide. The velocity of a bulk wave propagating in the substrate 401 is higher than the velocity of an acoustic wave propagating along the piezoelectric layer 430. The bulk wave propagating in the substrate 401 here denotes one bulk wave of the lowest acoustic velocity among bulk waves propagating in the substrate 401.

The transmit filter 131 may further include a high acoustic velocity film provided between the substrate 401 and the low acoustic velocity film 420. The high acoustic velocity film is configured such that the velocity of a bulk wave propagating in the high acoustic velocity film is lower than the velocity of an acoustic wave propagating along the piezoelectric layer 430. The material of the high acoustic velocity film may be, for example, silicon nitride. The material of the high acoustic velocity film is, however, not limited to silicon nitride, and may include at least one material selected from the group consisting of diamond-like carbon, aluminum nitride, silicon carbide, silicon nitride, silicon oxynitride, silicon, sapphire, lithium tantalate, lithium niobate, quartz-crystal, zirconia, cordierite, mullite, steatite, forsterite, magnesia, and diamond.

The thickness of the piezoelectric layer 430 is, for example, 3.5λ or less, where λ is a wave length of an acoustic wave determined by the cycle period of electrode fingers of the IDT electrodes 415. The thickness of the low acoustic velocity film 420 is, for example, 2.0λ or less.

The transmit filter 131 may include, for example, a fixing layer interposed between the low acoustic velocity film 420 and the piezoelectric layer 430. The fixing layer is made of, for example, resin (epoxy resin or polyimide resin). The transmit filter 131 may include a dielectric film between the low acoustic velocity film 420 and the piezoelectric layer 430, on the piezoelectric layer 430, or under the low acoustic velocity film 420.

The outer electrode 45 in contact with the conductive layer 6 is extended through the substrate 401, the insulating layer 450, the spacer layer 417, and the cover member 418. Of the outer electrode 45 in contact with the conductive layer 6, a portion extended through the substrate 401 is, for example, a through-silicon via (TSV).

In the receive filter 171 of the radio-frequency module 100d according to the second embodiment, the substrate 1001 is a silicon substrate. The receive filter 171 includes a low acoustic velocity film 1020 provided on the first major surface 1011 of the substrate 1001 and a piezoelectric layer 1030 provided on the low acoustic velocity film 1020. In the receive filter 171, the substrate 1001, the low acoustic velocity film 1020, and the piezoelectric layer 1030 form a piezoelectric substrate. In the receive filter 171, the circuit portion 1014 including the IDT electrodes 1015 is formed on the piezoelectric layer 1030.

When viewed in plan view in the thickness direction of the substrate 1001, the low acoustic velocity film 1020 is positioned away from the outer periphery of the substrate 1001. The receive filter 171 further includes an insulating layer 1050 that covers, of the first major surface 1011 of the substrate 1001, an area not covered with the low acoustic velocity film 1020. The insulating layer 1050 is electrically non-conductive. The insulating layer 1050 is formed along the outer edges of the substrate 1001 on the first major surface 1011 of the substrate 1001. The insulating layer 1050 is provided around the IDT electrodes 1015. When viewed in plan view in the thickness direction of the substrate 1001, the insulating layer 1050 is shaped as a frame (for example, a rectangular frame). A portion of the insulating layer 1050 overlaps the outer periphery of the piezoelectric layer 1030 in the thickness direction of the substrate 1001. The insulating layer 1050 covers the outer side surface of the piezoelectric layer 1030 and the outer side surface of the low acoustic velocity film 1020. The material of the insulating layer 1050 is, for example, epoxy resin or polyimide.

The material of the piezoelectric layer 1030 is, for example, lithium niobate or lithium tantalate. The low acoustic velocity film 1020 is configured such that the velocity of a bulk wave propagating in the low acoustic velocity film 1020 is lower than the velocity of a bulk wave propagating in the piezoelectric layer 1030. The material of the low acoustic velocity film 1020 is, for example, silicon oxide. The material of the low acoustic velocity film 1020 is, however, not limited to silicon oxide, and may include at least one material selected from the group consisting of tantalum oxide, and compounds made by adding fluorine, carbon, or boron to silicon oxide.

The receive filter 171 may further include a high acoustic velocity film provided between the substrate 1001 and the low acoustic velocity film 1020.

In the radio-frequency module 100d according to the second embodiment, as with the radio-frequency module 100 according to the first embodiment, the third major surface 23 (see FIG. 3) of the electronic component body 2 of the electronic component 1 forms the major surface 11 of the electronic component 1, and the third major surface 23 is in contact with the conductive layer 6. The outer electrodes 3 are arranged on the fourth major surface 24 of the electronic component body 2, but the outer electrodes 3 are not extended over the third major surface 23 (see FIG. 3). As a result, in the radio-frequency module 100d according to the second embodiment, the element value (inductance) of the circuit element 15 (see FIG. 3) included in the electronic component 1 can be increased.

Further, in the radio-frequency module 100d according to the second embodiment, the outer electrode 45 in contact with the conductive layer 6 is extended through the second electronic component 4 in the thickness direction of the second electronic component 4. This structure makes the ground in the transmit filter 131 implemented as the second electronic component 4 stronger.

Other Modifications

The first and second embodiments described above are merely examples of various embodiments of the present disclosure. Various modifications to the above examples including the first and second embodiments may be made for, for example, different designs when the possible benefits of the present disclosure can be achieved; different constituent elements of different embodiments may be combined in any appropriate manner.

For example, in the first electronic component 1, the outer electrodes 3 are not necessarily provided over both the fourth major surface 24 and the outer side surface 25 of the electronic component body 2; it is sufficient that the outer electrodes 3 be provided over the fourth major surface 24 out of the fourth major surface 24 and the outer side surface 25.

Figure 14:
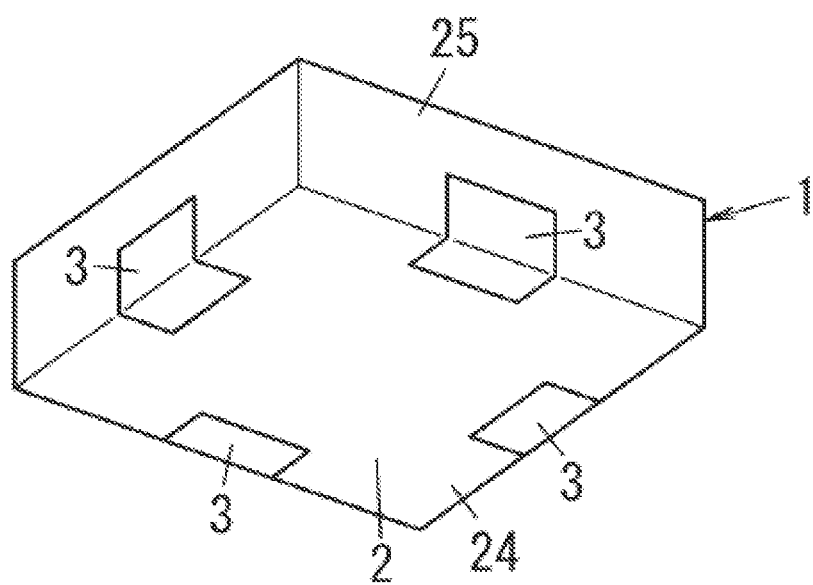
FIG. 14 is a perspective view of an LC filter as another example of a first electronic component when viewed from below.

The first electronic component 1 is not limited to an inductor or capacitor; the first electronic component 1 may be, for example, an LC filter as illustrated in FIG. 14. The first electronic component 1 implemented by the LC filter illustrated in FIG. 14 includes four outer electrodes 3 provided over the fourth major surface 24 and the outer side surface 25 of the electronic component body 2. The four outer electrodes 3 include an outer electrode 3 corresponding to an input terminal of the LC filter, an outer electrode 3 corresponding to an output terminal of the LC filter, and two outer electrodes 3 corresponding to two ground terminals of the LC filter. When the first electronic component 1 is an LC filter, the circuit elements included in the first electronic component 1 are an inductor and a capacitor. The LC filter is, for example, a low pass filter or a high pass filter. When the LC filter is, for example, a low pass filter, the LC filter is provided in a signal path between the antenna terminal 81 (see FIG. 5) and the first switch 104 (see FIG. 5).

In the radio-frequency modules 100a, 100b, 100c, and 100d, the resin layer 5 does not necessarily cover the entire portion of the outer side surface 13 of the first electronic component 1; it is sufficient that the resin layer 5 cover at least a portion of the outer side surface 13. The resin layer 5 does not necessarily cover the entire portion of the outer side surface 43 of the second electronic component 4; it is sufficient that the resin layer 5 cover at least a portion of the outer side surface 43. The resin layer 5 does not necessarily cover the entire portion of the outer side surface 73 of the third electronic component 7; it is sufficient that the resin layer 5 cover at least a portion of the outer side surface 73. The resin layer 5 does not necessarily cover the entire portion of the major surface 71 of the third electronic component 7; it is sufficient that the resin layer 5 cover at least a portion of the major surface 71. The resin layer 5 does not necessarily cover the entire portion of the outer side surface 103 of the fourth electronic component 10; it is sufficient that the resin layer 5 cover at least a portion of the outer side surface 103.

In the radio-frequency modules 100a, 100b, 100c, and 100d, the conductive layer 6 does not necessarily cover the entire portion of the major surface 51 of the resin layer 5; it is sufficient that the conductive layer 6 cover at least a portion of the major surface 51 of the resin layer 5. The conductive layer 6 does not necessarily cover the entire portion of the major surface 11 of the first electronic component 1; it is sufficient that the conductive layer 6 cover at least a portion of the major surface 11 of the first electronic component 1. The conductive layer 6 does not necessarily cover the entire portion of the major surface 41 of the second electronic component 4; it is sufficient that the conductive layer 6 cover at least a portion of the major surface 41 of the second electronic component 4. The conductive layer 6 does not necessarily cover the entire portion of the major surface 101 of the fourth electronic component 10; it is sufficient that the conductive layer 6 cover at least a portion of the major surface 101 of the fourth electronic component 10.

In the radio-frequency module 100, when viewed in plan view in the thickness direction D1 of the mounting board 9, the first electronic component 1 may be positioned between the first inductor L1 included in the output matching network 113 and the second inductor L2 included in the input matching network 123. In this case, in the radio-frequency module 100, it is possible to inhibit the electromagnetic coupling between the first inductor L1 included in the output matching network 113 and the second inductor L2 included in the input matching network 123.

In the radio-frequency modules 100a, 100b, 100c, and 100d, the circuit components of the second group to be mounted on the second major surface 92 of the mounting board 9 may be mounted on the first major surface 91 instead of the second major surface 92 of the mounting board 9. In this case, in the radio-frequency modules 100a, 100b, 100c, and 100d, no circuit component is mounted on the second major surface 92 of the mounting board 9.

In the radio-frequency modules 100, 100b, and 100d, as with the radio-frequency module 100c, the major surface opposite to the mounting board 9 side of a circuit component mounted on the second major surface 92 of the mounting board 9 (a second-major-surface-side electronic component) may be exposed at the major surface 191 opposite to the mounting board 9 side of the second resin layer 19. This structure reduces the height of the radio-frequency modules 100, 100b, and 100d. The circuit component mounted on the second major surface 92 of the mounting board 9 and having the major surface exposed opposite to the mounting board 9 side may be, for example, a capacitor, an inductor, an LC filter, an acoustic wave filter, and an IC chip. The circuit component mounted on the second major surface 92 of the mounting board 9 and having the major surface exposed opposite to the mounting board 9 side may be a multilayer ceramic capacitor or a capacitor formed on a silicon substrate.

The transmit filters 131 to 133 and the receive filters 171 to 173 are not limited to surface acoustic wave filters; the transmit filters 131 to 133 and the receive filters 171 to 173 may be, for example, bulk acoustic wave (BAW) filters. A resonator in the BAW filter is, for example, a film bulk acoustic resonator (FBAR) or solidly mounted resonator (SMR). The BAW filter includes a substrate. The substrate is, for example, a silicon substrate.

The transmit filters 131 to 133 and the receive filters 171 to 173 are not limited to ladder filters; the transmit filters 131 to 133 and the receive filters 171 to 173 may be, for example, longitudinally coupled resonator-type surface acoustic wave filters.

The acoustic wave filters use a surface acoustic wave or bulk acoustic wave; but this is not to be interpreted as limiting; the acoustic wave filters may be acoustic wave filters using, for example, a boundary acoustic wave or plate wave.

The circuit configuration of the radio-frequency modules 100 to 100d is not limited to the examples described above. The radio-frequency modules 100 to 100d may include, as a circuit configuration, for example, a multi input multi output (MIMO) radio-frequency front-end circuit.

The communication device 300 according to the first embodiment may include, instead of the radio-frequency module 100, the radio-frequency module 100a, 100b, 100c, or 100d.

Aspects

This specification discloses the following aspects.

A radio-frequency module (100; 100a; 100b; 100c; 100d) according to a first aspect includes a mounting board (9), an electronic component (1), a resin layer (5), and a conductive layer (6). The mounting board (9) has a first major surface (91) and a second major surface (92) that are opposite to each other. The electronic component (1) is mounted on the first major surface (91) of the mounting board (9). The resin layer (5) is provided on the first major surface (91) of the mounting board (9). The resin layer (5) covers at least a portion of an outer side surface (13) of the electronic component (1). The conductive layer (6) covers at least a portion of a major surface (51) opposite to the mounting board (9) side of the resin layer (5) and at least a portion of a major surface (11) opposite to the mounting board (9) side of the electronic component (1). The electronic component (1) includes an electronic component body (2) and a plurality of outer electrodes (3). The electronic component body (2) includes an electrical insulating portion (21) and a conductive portion (14) provided inside the electrical insulating portion (21), forming at least a portion of a circuit element (15) of the electronic component (1). The electronic component body (2) has a third major surface (23) and a fourth major surface (24), which are opposite to each other, and an outer side surface (25). In the electronic component (1), the third major surface (23) of the electronic component body (2) forms the major surface (11) of the electronic component (1), and the third major surface (23) is in contact with the conductive layer (6). The plurality of outer electrodes (3) are provided on the fourth major surface (24) of the electronic component body (2), but the plurality of outer electrodes (3) are not extended over the third major surface (23).

In the radio-frequency module (100; 100a; 100b; 100c; 100d) according to the first aspect, the element value of the circuit element (15) included in the electronic component (1) can be increased.

In the radio-frequency module (100; 100a; 100b; 100c; 100d) according to a second aspect, with respect to the first aspect, the plurality of outer electrodes (3) are provided over both the fourth major surface (24) of the electronic component body (2) and the outer side surface (25) of the electronic component body (2).

In the radio-frequency module (100; 100a; 100b; 100c; 100d) according to the second aspect, the strength of connecting the mounting board (9) and the electronic component (1) can be improved.

In the radio-frequency module (100; 100a; 100b; 100c; 100d) according to a third aspect, with respect to the first or second aspect, the electronic component (1) is a capacitor, an inductor, or an LC filter.

In the radio-frequency module (100; 100a; 100b; 100c; 100d) according to the third aspect, when the electronic component (1) is a capacitor (C3), the capacitance can be increased; when the electronic component (1) is an inductor (the second inductor L2), the inductance can be increased; when the electronic component (1) is an LC filter, at least either the inductance of an inductor included in the LC filter or the capacitance of a capacitor included in the LC filter can be increased.

In the radio-frequency module according to a fourth aspect, with respect to the third aspect, the material of the electrical insulating portion (the multilayer ceramic structure 20) includes a ceramic. The third major surface (23) of the electronic component body (2) is a portion of a part made of a ceramic of the electronic component body (2).

In the radio-frequency module (100; 100a; 100b; 100c; 100d) according to a fifth aspect, with respect to the fourth aspect, the electronic component (1) is a multilayer ceramic capacitor, a multilayer ceramic inductor, or a multilayer ceramic LC filter.

The radio-frequency module (100; 100a; 100b; 100c; 100d) according to a sixth aspect, with respect to any one of the first to fifth aspects, includes a second electronic component (4) different from a first electronic component (1) that is the electronic component (1); the second electronic component (4) is mounted on the first major surface (91) of the mounting board (9). The resin layer (5) covers at least a portion of an outer side surface (43) of the second electronic component (4). The conductive layer (6) covers at least a portion of a major surface (41) opposite to the mounting board (9) side of the second electronic component (4). The major surface (41) of the second electronic component (4) is in contact with the conductive layer (6).

The height of the radio-frequency module (100; 100a; 100b; 100c; 100d) according to the sixth aspect can be reduced.

In the radio-frequency module (100d) according to the seventh aspect, with respect to the sixth aspect, the second electronic component (4) includes a plurality of outer electrodes (45). One or some outer electrodes (45) of the plurality of outer electrodes (45) of the second electronic component (4) are in contact with the conductive layer (6).

In the radio-frequency module (100d) according to the seventh aspect, one or some outer electrodes (45) of the second electronic component (4) are electrically coupled to the conductive layer (6).

In the radio-frequency module (100d) according to the eighth aspect, with respect to the seventh aspect, the one or some outer electrodes (45) of the plurality of outer electrodes (45) are extended through the second electronic component (4) in the thickness direction of the second electronic component (4).

In the radio-frequency module (100d) according to the eighth aspect, the ground in the second electronic component (4) is made stronger.

The radio-frequency module (100; 100a; 100b; 100c; 100d) according to a ninth aspect, with respect to any one of the sixth to eighth aspects, the second electronic component (4) includes a substrate (401) and a circuit portion (414). The substrate (401) has a first major surface (411) and a second major surface (412) that are opposite to each other. The circuit portion (414) is formed on the first major surface (411) side of the substrate (401). In the second electronic component (4), the second major surface (412) of the substrate (401) forms the major surface (41) of the second electronic component (4). The second electronic component (4) is an acoustic wave filter or integrated circuit (IC) chip.

In the radio-frequency module (100; 100a; 100b; 100c) according to the tenth aspect, with respect to the ninth aspect, the second electronic component (4) is an acoustic wave filter. The substrate (401) is a lithium tantalate substrate or a lithium niobate substrate.

In the radio-frequency module (100d) according to an eleventh aspect, with respect to the ninth aspect, the substrate (401) is a silicon substrate.

In the radio-frequency module (100; 100a; 100b; 100c; 100d) according to the twelfth aspect, with respect to any one of the sixth to eleventh aspects, when a plane including at least a portion of the first major surface (91), perpendicular to a thickness direction (D1) of the mounting board (9), is designated as a reference plane (RP1), a first distance (H1) between the reference plane (RP1) and the major surface (11) of the first electronic component (1) is equal to a second distance (H2) between the reference plane (RP1) and the major surface (41) of the second electronic component (4).

The height of the radio-frequency module (100; 100a; 100b; 100c; 100d) according to the twelfth aspect in the thickness direction (D1) of the mounting board (9) can be reduced.

In the radio-frequency module (100; 100a; 100b; 100c; 100d) according to the thirteenth aspect, with respect to any one of the sixth to twelfth aspects, the major surface (11) of the first electronic component (1) and the major surface (41) of the second electronic component (4) are rough surfaces.

In the radio-frequency module (100; 100a; 100b; 100c; 100d) according to the thirteenth aspect, the fixity of the major surface (11) of the first electronic component (1) and the major surface (41) of the second electronic component (4) with the conductive layer (6) can be improved.

The radio-frequency module (100; 100a; 100b; 100c; 100d) according to the fourteenth aspect, with respect to the thirteenth aspect, further includes a third electronic component (7). The third electronic component (7) is mounted on the first major surface (91) of the mounting board (9). The third electronic component (7) is lower in height than the first electronic component (1) and the second electronic component (4). The resin layer (5) covers a major surface (71) opposite to the mounting board (9) side of the third electronic component (7). The maximum height roughness of the major surface (11) of the first electronic component (1) and the maximum height roughness of the major surface (41) of the second electronic component (4) are greater than the maximum height roughness of the major surface (71) of the third electronic component (7).

In the radio-frequency module (100; 100a; 100b; 100c; 100d) according to the fourteenth aspect, the fixity of the major surface (11) of the first electronic component (1) and the major surface (41) of the second electronic component (4) with the conductive layer (6) can be improved.

The radio-frequency module (100b) according to the fifteenth aspect, with respect to the fourteenth aspect, further includes a fourth electronic component (10) mounted on the first major surface (91) of the mounting board (9). The resin layer (5) covers at least a portion of an outer side surface (103) of the fourth electronic component (10). The conductive layer (6) covers at least a portion of a major surface (101) opposite to the mounting board (9) side of the fourth electronic component (10). The major surface (101) of the fourth electronic component (10) is in contact with the conductive layer (6). The first electronic component (1), the second electronic component (4), and the fourth electronic component (10) are different from each other with respect to the material of a portion in contact with the conductive layer (6).

The radio-frequency module (100c) according to the sixteenth aspect, with respect to any one of the sixth to fourteenth aspects, further includes a fourth electronic component (10). The fourth electronic component (10) is mounted on the first major surface (91) of the mounting board (9). The second electronic component (4) is a transmit filter (131). The fourth electronic component (10) is a receive filter (171). When viewed in plan view in the thickness direction (D1) of the mounting board (9), the first electronic component (1) is positioned between the second electronic component (4) and the fourth electronic component (10).

In the radio-frequency module (100c) according to the sixteenth aspect, the electromagnetic coupling between the transmit filter (131) implemented as the second electronic component (4) and the receive filter (171) implemented as the fourth electronic component (10) is inhibited. Moreover, in the radio-frequency module (100c) according to the sixteenth aspect, the transmit filter (131) as the second electronic component (4) is in contact with the conductive layer (6). This structure suppresses the temperature increase of the transmit filter (131). As a result, in the radio-frequency module (100c), the temperature characteristic of the transmit filter (131) is made stable, and consequently, the characteristics of the radio-frequency module (100c) can be made stable.

The radio-frequency module (100; 100a; 100b; 100c; 100d) according to the seventeenth aspect, with respect to any one of the first to sixteenth aspects, further includes a power amplifier (111), an output matching network (113), a low-noise amplifier (121), and an input matching network (123). The power amplifier (111) is mounted on the first major surface (91) of the mounting board (9). The output matching network (113) is coupled to an output terminal of the power amplifier (111). The low-noise amplifier (121) is mounted on the second major surface (92) of the mounting board (9). The input matching network (123) is coupled to an input terminal of the low-noise amplifier (121). The output matching network (113) includes a first inductor (L1). The input matching network (123) includes a second inductor (L2). When viewed in plan view in the thickness direction (D1) of the mounting board (9), the electronic component (1) is positioned between the first inductor (L1) and the second inductor (L2).

In the radio-frequency module (100; 100a; 100b; 100c; 100d) according to the seventeenth aspect, it is possible to inhibit the electromagnetic coupling between the first inductor (L1) included in the output matching network (113) and the second inductor (L2) included in the input matching network (123).

The radio-frequency module (100; 100a; 100b; 100c; 100d) according to the eighteenth aspect, with respect to any one of the first to seventeenth aspects, further includes a plurality of external connection terminals (8). The plurality of external connection terminals (8) are provided on the second major surface (92) of the mounting board (9). The plurality of external connection terminals (8) include a ground terminal (85) coupled to the conductive layer (6).

In the radio-frequency module (100; 100a; 100b; 100c; 100d) according to the eighteenth aspect, the electric potential at the conductive layer (6) can be set at almost the same potential as the ground terminal (85).

The radio-frequency module (100; 100a; 100b; 100c; 100d) according to a nineteenth aspect, with respect to any one of the first to eighteenth aspects, further includes a circuit component (the first inductor L1, the third inductor L3) mounted on the second major surface (92) of the mounting board (9).

When viewed in plan view in the thickness direction (D1) of the mounting board (9), the size of the radio-frequency module (100; 100a; 100b; 100c; 100d) according to the nineteenth aspect can be reduced.

In the radio-frequency module (100; 100a; 100b; 100c; 100d) according to a twentieth aspect, with respect to the nineteenth aspect, the circuit component is a capacitor, an inductor, an LC filter, an acoustic wave filter, or an IC chip.

In the radio-frequency module (100; 100a; 100b; 100c; 100d) according to the twentieth aspect, when the circuit component is a capacitor, the capacitance can be increased;

when the circuit component is an inductor (the first inductor L1, the third inductor L3), the inductance can be increased; when the circuit component is an LC filter, at least either the inductance of an inductor included in the LC filter or the capacitance of a capacitor included in the LC filter can be increased.

In the radio-frequency module (100; 100a; 100b; 100c; 100d) according to a twenty-first aspect, with respect to the twentieth aspect, the circuit component is a multilayer ceramic capacitor or a capacitor formed on a silicon substrate.

The radio-frequency module (100; 100b; 100c; 100d) according to the twenty-second aspect, with respect to any one of the nineteenth to twenty-first aspects, further includes a second resin layer (19) different from a first resin layer (5) that is the resin layer (5). The second resin layer (19) is provided on the second major surface (92) of the mounting board (9), and the second resin layer (19) covers at least a portion of an outer side surface of the circuit component.

In the radio-frequency module (100; 100b; 100c; 100d) according to the twenty-second aspect, the circuit component is protected by the second resin layer (19).

In the radio-frequency module (100; 100b; 100c; 100d) according to a twenty-third aspect, with respect to the twenty-second aspect, a major surface (SL1, SL3) opposite to the mounting board (9) side of the circuit component (the first inductor L1, the third inductor L3) is exposed at a major surface (191) opposite to the mounting board (9) side of the second resin layer (19).

The height of the radio-frequency module (100; 100b; 100c; 100d) according to the twenty-third aspect can be reduced.

A communication device (300) according to a twenty-fourth aspect includes the radio-frequency module (100; 100a; 100b; 100c; 100d) according to any one of the first to twenty-third aspects and a signal processing circuit (301). The signal processing circuit (301) is coupled to the radio-frequency module (100; 100a; 100b; 100c; 100d).

In the communication device (300) according to the twenty-fourth aspect, the element value of the circuit element (15) included in the electronic component (1) can be increased.

1 electronic component (first electronic component)
 11 major surface (first major surface)
 13 outer side surface
 14 conductive portion
 15 circuit element
 2 electronic component body
 20 multilayer ceramic structure
 21 electrical insulating portion
 23 third major surface
 24 fourth major surface
 25 outer side surface
 26 winding portion
 27 conductive layer
 28 first inner electrode
 29 second inner electrode
 3 outer electrode
 4 second electronic component
 41 major surface
 43 outer side surface
 45 outer electrode
 401 substrate
 411 first major surface
 412 second major surface
 414 circuit portion
 415 IDT electrode
 417 spacer layer
 418 cover member
 420 low acoustic velocity film
 430 piezoelectric layer
 5 resin layer (first resin layer)
 51 major surface
 53 outer side surface
 6 conductive layer
 7 third electronic component
 8 external connection terminal
 81 antenna terminal
 82 signal input terminal
 83 signal output terminal
 84 control terminal
 85 ground terminal
 9 mounting board
 91 first major surface
 92 second major surface
 93 outer side surface
 10 fourth electronic component
 101 major surface
 103 outer side surface
 1045 outer electrode
 1001 substrate
 1011 first major surface
 1012 second major surface
 1014 circuit portion
 1015 IDT electrode
 1017 spacer layer
 1018 cover member
 19 second resin layer
 191 major surface
 193 outer side surface
 104 first switch
 140 common terminal
 141, 142, 143 selection terminal
 105 second switch
 150 common terminal
 151, 152, 153 selection terminal
 106 third switch
 160 common terminal
 161, 162, 163 selection terminal
 108 IC chip
 111 power amplifier
 113 output matching network
 114 matching network
 115 controller
 1150 substrate
 1151 first major surface
 1152 second major surface
 1154 circuit portion
 121 low-noise amplifier
 123 input matching network
 131 transmit filter (first transmit filter)
 132 transmit filter (second transmit filter)
 133 transmit filter (third transmit filter)
 171 receive filter (first receive filter)
 172 receive filter (second receive filter)
 173 receive filter (third receive filter)
 100, 100a, 100b, 100c, 100d radio-frequency module
 300 communication device
 301 signal processing circuit
 302 RF signal processing circuit
 303 baseband signal processing circuit
 310 antenna
 C3 capacitor
 D1 thickness direction H1 first distance
H2 second distance
H3 third distance
H4 fourth distance
H5 fifth distance
L1 first inductor
SL1 major surface
L2 second inductor
L3 third inductor
SL3 major surface
r1 signal path
T1 node

The invention claimed is:

1. A radio-frequency module comprising:
a mounting board having a first major surface and a second major surface, the first major surface and the second major surface being opposite to each other;
a first electronic component mounted on the first major surface of the mounting board;
a first resin layer provided on the first major surface of the mounting board, the first resin layer covering at least a portion of an outer side surface of the first electronic component; and
a conductive layer covering at least a portion of a major surface opposite to a mounting board side of the first resin layer and at least a portion of a major surface opposite to a mounting board side of the first electronic component, wherein
the first electronic component includes
an electronic component body including an electrical insulating portion and a conductive portion provided inside the electrical insulating portion, the conductive portion forming at least a portion of a circuit element of the first electronic component, the electronic component body having a third major surface, a fourth major surface and an outer side surface, the third major surface and the fourth major surface being opposite to each other, and
a plurality of outer electrodes, and
in the first electronic component,
the third major surface of the electronic component body forms the major surface of the first electronic component, and the third major surface of the electronic component body is in contact with the conductive layer, and
the plurality of outer electrodes are provided on the fourth major surface of the electronic component body, and the plurality of outer electrodes are not extended over the third major surface.

2. The radio-frequency module according to claim 1, wherein
the plurality of outer electrodes are provided over both the fourth major surface of the electronic component body and the outer side surface of the electronic component body.

3. The radio-frequency module according to claim 1, wherein
the first electronic component is a capacitor, an inductor, or an LC filter.

4. The radio-frequency module according to claim 3, wherein
a material of the electrical insulating portion includes a ceramic, and
the third major surface of the electronic component body is a portion of a ceramic part of the electronic component body.

5. The radio-frequency module according to claim 4, wherein
the first electronic component is a multilayer ceramic capacitor, a multilayer ceramic inductor, or a multilayer ceramic LC filter.

6. The radio-frequency module according to claim 1, further comprising:
a second electronic component different from the first electronic component, the second electronic component being mounted on the first major surface of the mounting board, wherein
the first resin layer covers at least a portion of an outer side surface of the second electronic component,
the conductive layer covers at least a portion of a major surface opposite to a mounting board side of the second electronic component, and
the major surface of the second electronic component is in contact with the conductive layer.

7. The radio-frequency module according to claim 6, wherein
the second electronic component includes a plurality of outer electrodes, and
one or some outer electrodes of the plurality of outer electrodes of the second electronic component are in contact with the conductive layer.

8. The radio-frequency module according to claim 7, wherein
the one or some outer electrodes of the plurality of outer electrodes are extended through the second electronic component in a thickness direction of the second electronic component.

9. The radio-frequency module according to claim 6, wherein
the second electronic component includes
a substrate having a first major surface and a second major surface, the first major surface and the second major surface being opposite to each other, and
a circuit portion provided on a first major surface side of the substrate,
in the second electronic component, the second major surface of the substrate forms the major surface of the second electronic component, and
the second electronic component is an acoustic wave filter or an integrated circuit (IC) chip.

10. The radio-frequency module according to claim 9, wherein
the second electronic component is the acoustic wave filter, and
the substrate is a lithium tantalate substrate or a lithium niobate substrate.

11. The radio-frequency module according to claim 9, wherein
the substrate is a silicon substrate.

12. The radio-frequency module according to claim 6, wherein
when a plane including at least a portion of the first major surface, perpendicular to a thickness direction of the mounting board, is designated as a reference plane,
a first distance between the reference plane and the major surface of the first electronic component is equal to a second distance between the reference plane and the major surface of the second electronic component.

13. The radio-frequency module according to claim 6, wherein the major surface of the first electronic component and the major surface of the second electronic component are rough surfaces.

14. The radio-frequency module according to claim 13, further comprising:
a third electronic component mounted on the first major surface of the mounting board, the third electronic component being lower in height than the first electronic component and the second electronic component, wherein
the first resin layer covers a major surface opposite to a mounting board side of the third electronic component, and
each of a maximum height roughness of the major surface of the first electronic component and a maximum height roughness of the major surface of the second electronic component is greater than a maximum height roughness of the major surface of the third electronic component.

15. The radio-frequency module according to claim 14, further comprising:
a fourth electronic component mounted on the first major surface of the mounting board, wherein
the first resin layer covers at least a portion of an outer side surface of the fourth electronic component,
the conductive layer covers at least a portion of a major surface opposite to a mounting board side of the fourth electronic component,
the major surface of the fourth electronic component is in contact with the conductive layer, and
the first electronic component, the second electronic component, and the fourth electronic component are different from each other with respect to a material of a portion in contact with the conductive layer.

16. The radio-frequency module according to claim 6, further comprising:
a fourth electronic component mounted on the first major surface of the mounting board, wherein
the second electronic component is a transmit filter,
the fourth electronic component is a receive filter, and
when viewed in plan view in a thickness direction of the mounting board, the first electronic component is positioned between the second electronic component and the fourth electronic component.

17. The radio-frequency module according to claim 1, further comprising:
a power amplifier mounted on the first major surface of the mounting board;
an output matching network coupled to an output terminal of the power amplifier;
a low-noise amplifier mounted on the second major surface of the mounting board; and
an input matching network coupled to an input terminal of the low-noise amplifier, wherein
the output matching network includes a first inductor,
the input matching network includes a second inductor, and
when viewed in plan view in a thickness direction of the mounting board, the first electronic component is positioned between the first inductor and the second inductor.

18. The radio-frequency module according to claim 1, further comprising:
a plurality of external connection terminals provided on the second major surface of the mounting board, wherein
the plurality of external connection terminals include a ground terminal coupled to the conductive layer.

19. The radio-frequency module according to claim 1, further comprising:
a circuit component mounted on the second major surface of the mounting board.

20. The radio-frequency module according to claim 19, wherein
the circuit component is a capacitor, an inductor, an LC filter, an acoustic wave filter, or an IC chip.

21. The radio-frequency module according to claim 20, wherein
the circuit component is a multilayer ceramic capacitor or a capacitor provided on a silicon substrate.

22. The radio-frequency module according to claim 19, further comprising:
a second resin layer different from the first resin layer, wherein
the second resin layer is provided on the second major surface of the mounting board, and the second resin layer covers at least a portion of an outer side surface of the circuit component.

23. The radio-frequency module according to claim 22, wherein
a major surface opposite to a mounting board side of the circuit component is exposed at a major surface opposite to a mounting board side of the second resin layer.

24. A communication device comprising:
the radio-frequency module according to claim 1; and
a signal processing circuit coupled to the radio-frequency module.

* * * * *